(12) United States Patent
Chen et al.

(10) Patent No.: US 9,861,196 B2
(45) Date of Patent: Jan. 9, 2018

(54) SLIDE RAIL ASSEMBLY WITH INTERLOCK DEVICE

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chi-Wei Wu, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 15/213,645

(22) Filed: Jul. 19, 2016

(65) Prior Publication Data

US 2017/0079428 A1 Mar. 23, 2017

(30) Foreign Application Priority Data

Sep. 18, 2015 (TW) .............................. 104131079 A

(51) Int. Cl.
| A47B 88/04 | (2006.01) |
| E05B 65/46 | (2017.01) |
| E05B 65/463 | (2017.01) |
| A47B 97/00 | (2006.01) |
| A47B 88/50 | (2017.01) |

(52) U.S. Cl.
CPC ........ *A47B 88/0418* (2013.01); *E05B 65/463* (2013.01); *A47B 88/50* (2017.01); *A47B 2097/008* (2013.01)

(58) Field of Classification Search
CPC ......... A47B 88/40; A47B 88/50; A47B 88/57; A47B 2210/01; A47B 2097/008; E05B 65/462; E05B 65/463
See application file for complete search history.

(56) References Cited

U.S. PATENT DOCUMENTS

| 3,733,113 | A | * | 5/1973 | Glassford | .............. A47B 88/57 312/334.27 |
| 4,355,851 | A | * | 10/1982 | Slusser | ................. E05B 65/463 312/215 |
| 7,055,701 | B2 | * | 6/2006 | Dean | .................... H05K 7/1489 211/190 |
| 7,484,817 | B2 | | 2/2009 | Hoffman et al. | |
| 7,540,573 | B2 | * | 6/2009 | Lin | ....................... E05B 65/463 312/217 |
| 8,297,723 | B2 | | 10/2012 | Chen et al. | |

(Continued)

FOREIGN PATENT DOCUMENTS

| DE | 29701427 U1 * | 3/1997 | ............. A47B 79/00 |
| GB | 2487624 A * | 8/2012 | ........... E05B 65/463 |

*Primary Examiner* — Andrew M Roersma
(74) *Attorney, Agent, or Firm* — Rosenberg, Klein & Lee

(57) ABSTRACT

A slide rail assembly includes a supporting rail, a first rail, a second rail, and an interlock device. The second rail can be displaced with respect to the first rail. The interlock device is movably disposed between the first rail and the supporting rail. The second rail displaces the interlock device while being displaced from a retracted position with respect to the first rail to a predetermined position in an opening direction.

14 Claims, 24 Drawing Sheets

(56) References Cited

U.S. PATENT DOCUMENTS

2011/0031859 A1* 2/2011 Briggs ................ E05B 65/462
　　　　　　　　　　　　　　　　　　　　312/333
2016/0105987 A1* 4/2016 Peng ................... H05K 7/1489
　　　　　　　　　　　　　　　　　　　　361/679.02

* cited by examiner

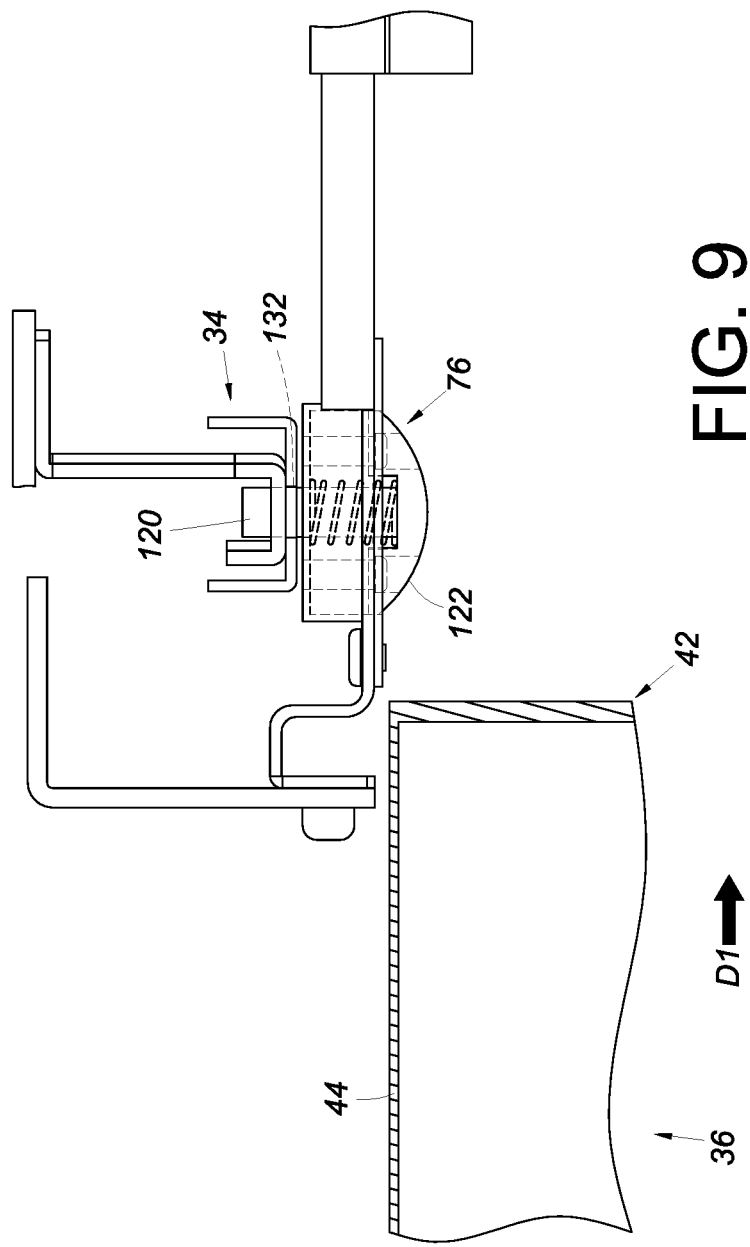

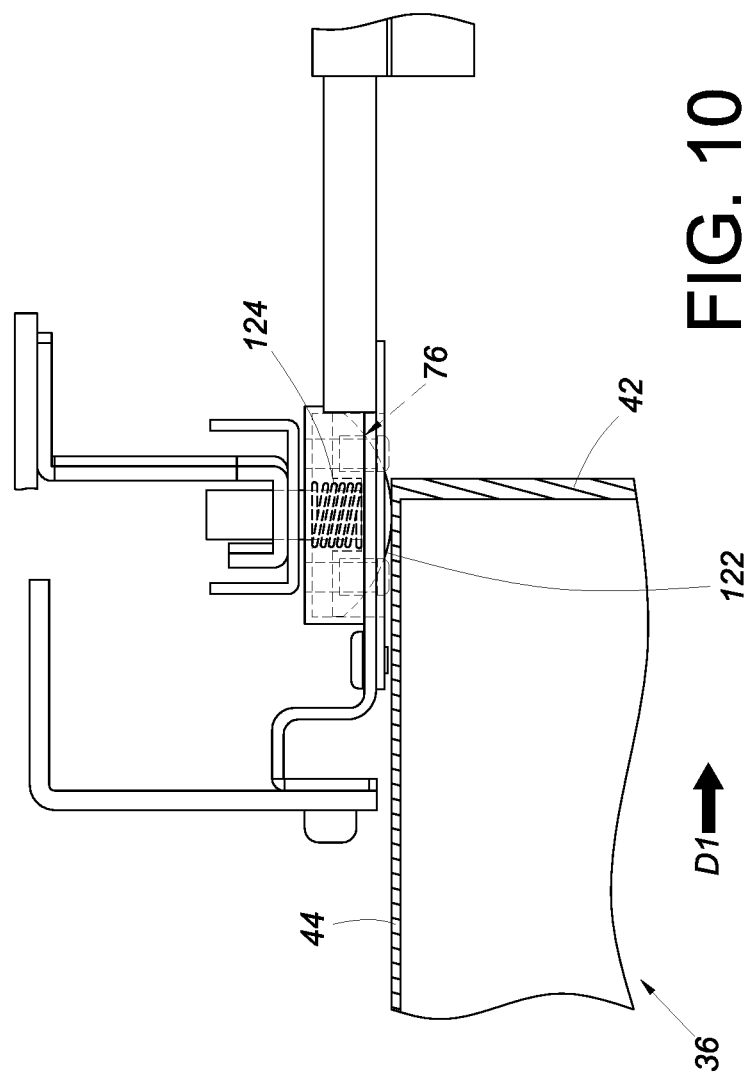

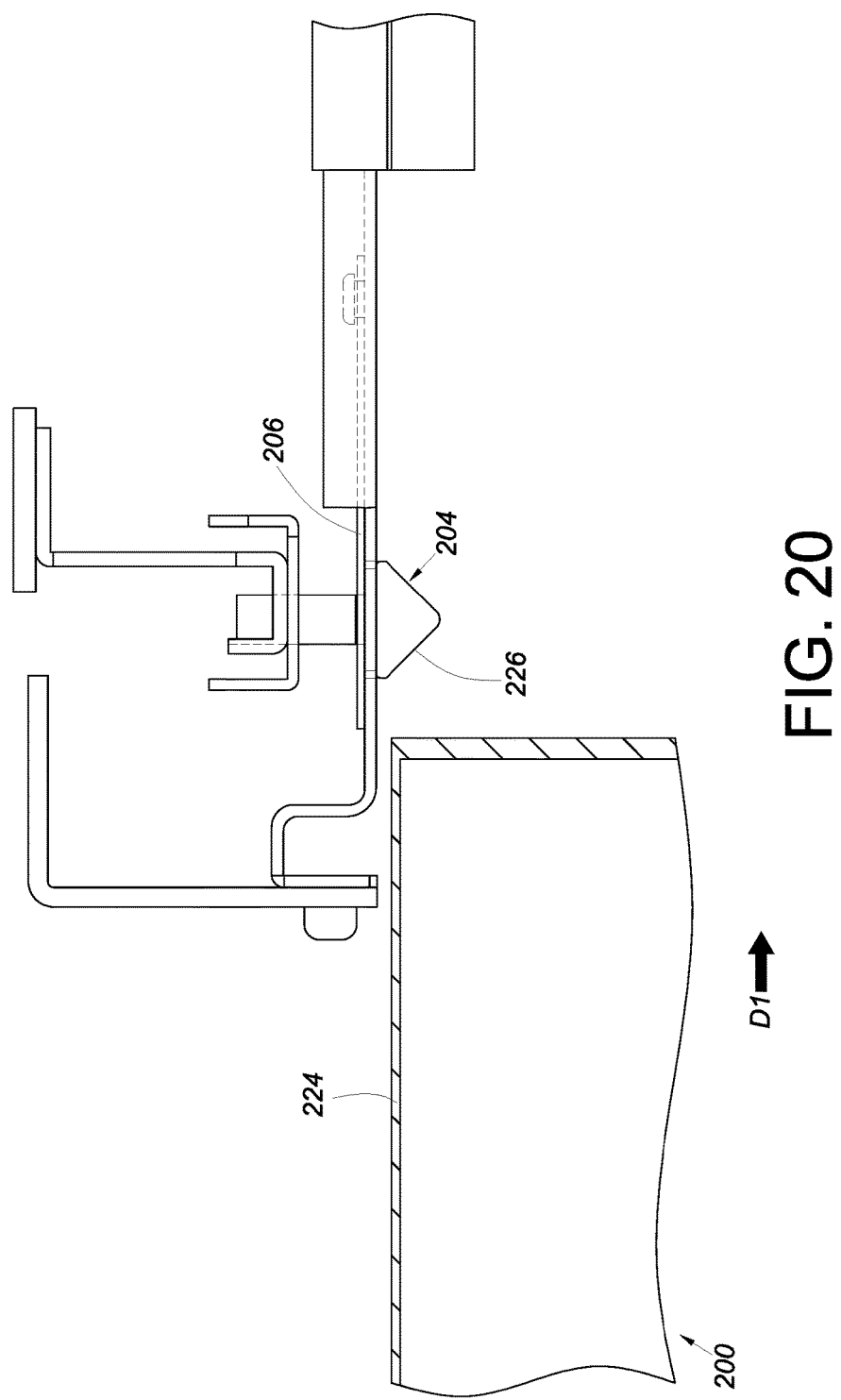

SLIDE RAIL ASSEMBLY WITH INTERLOCK DEVICE

FIELD OF THE INVENTION

The present invention relates to a slide rail assembly and more particularly to a slide rail assembly with an interlock device.

BACKGROUND OF THE INVENTION

Generally, a cabinet configured to carry a plurality of objects is equipped with a plurality of slide rail assemblies so that each object can be pulled out of and pushed back into the cabinet via moving rails of the corresponding slide rail assemblies. However, if too many of the objects are pulled out at the same time, the cabinet may topple as the center of gravity of the cabinet, including all the objects it carries, is shifted out of the cabinet. To prevent this from happening, it is common practice to limit the number of objects that can be pulled out simultaneously, or the objects are kept from being pulled out all at once. In a rack-mounted computer system, for example, plural pieces of electronic equipment can be pulled out of and retracted into a cabinet via their respective slide rail assemblies, and to avoid overbalancing, U.S. Pat. No. 8,297,723 B2, for instance, has disclosed an interlock device for use with slide rail assemblies, in which an interlock mechanism can lock a moving rail of a slide rail assembly against pulling when a moving rail of another slide rail assembly is pulled out with respect to a fixed rail. As market demands vary, it is an important issue in the related industry to develop interlocking mechanisms for rack-mounted equipment of specific shapes or configurations.

SUMMARY OF THE INVENTION

The present invention relates to a slide rail assembly in which an interlock device is configured to drive a linking member.

According to one aspect of the present invention, a slide rail assembly with an interlock device is provided for use with a rack system which includes a rack, a chassis, and a linking member, and in which the chassis has a wall provided with an opening. The slide rail assembly with the interlock device includes a first slide assembly and a first interlock device. The first slide rail assembly includes a first rail and a second rail which can be displaced with respect to the first rail. The first interlock device is provided between the first rail of the first slide rail assembly and the linking member through the opening. While the second rail of the first slide rail assembly is displaced from a retracted position with respect to the first rail of the first slide rail assembly to a predetermined position in an opening direction, the first interlock device is driven by the second rail of the first slide rail assembly to displace the linking member from a first position to a second position.

Preferably, the first interlock device includes a first locking member and a first engaging member. The first locking member is movably connected to the first rail of the first slide rail assembly. The first engaging member extends through the opening and is provided between the first locking member and the linking member.

Preferably, the slide rail assembly with the interlock device further includes a supporting frame which is connected to the first rail of the first slide rail assembly at a position adjacent to an end portion of the first rail, and the first locking member of the first interlock device can be moved with respect to the supporting frame. In addition, it is preferable that the supporting frame has an opening, that the first locking member of the first interlock device corresponds to the opening of the supporting frame, and that the first engaging member of the first interlock device is inserted through the opening of the supporting frame.

Preferably, one of the second rail of the first slide rail assembly and the first locking member of the first interlock device includes a guiding portion for guiding the second rail of the first slide rail assembly to push the first locking member of the first interlock device.

Preferably, the guiding portion has an inclined section.

Preferably, the slide rail assembly with the interlock device further includes an elastic member for applying an elastic force to the first engaging member of the first interlock device.

Preferably, the slide rail assembly with the interlock device further includes a second slide rail assembly and a second interlock device. The second slide rail assembly includes a first rail and a second rail which can be moved with respect to the first rail. The second interlock device has a blocking portion for blocking the second rail of the second slide rail assembly in response to displacement of the linking member from the first position to the second position.

Preferably, the second interlock device includes a second locking member and a second engaging member. The second locking member is movably connected to the first rail of the second slide rail assembly and is provided with the blocking portion. The second engaging member is provided between the second locking member and the linking member. While the linking member is displaced from the first position to the second position, the second engaging member drives the second locking member in order for the blocking portion of the second locking member to block the second rail of the second slide rail assembly.

Preferably, the slide rail assembly with the interlock device further includes a supporting rail mounted on the rack in order to carry the chassis.

Preferably, the first slide rail assembly is mounted on the wall of the chassis.

Preferably, the second rail of the first slide rail assembly is configured to carry an object.

According to another aspect of the present invention, a slide rail assembly includes a supporting rail, a first rail, a second rail which can be displaced with respect to the first rail, and an interlock device which is movably provided between the first rail and the supporting rail. The second rail displaces the interlock device while being displaced from a retracted position with respect to the first rail to a predetermined position in an opening direction.

Preferably, the interlock device includes a locking member and an engaging member. The locking member is movably connected to the first rail, and the engaging member is movably connected to the supporting rail. While being displaced from the retracted position with respect to the first rail to the predetermined position, the second rail drives the locking member in order to displace the engaging member.

Preferably, each of the first rail and the supporting rail has an opening, and the engaging member includes a first portion and a second portion connected to the first portion. The first portion of the engaging member is inserted through the locking member via the opening of the first rail. The second portion of the engaging member is inserted through the opening of the supporting rail.

BRIEF DESCRIPTION OF THE DRAWINGS

FIG. 9 shows how the first chassis of the first equipment in the first embodiment of the present invention is displaced with respect to the supporting rail in the first direction;

FIG. 10 shows how the first chassis in FIG. 9 is further displaced with respect to the supporting rail in the first direction;

FIG. 20 shows how the first equipment in the second embodiment of the present invention is displaced with respect to the supporting rail in the first direction;

DETAILED DESCRIPTION OF THE INVENTION

Figure 1:
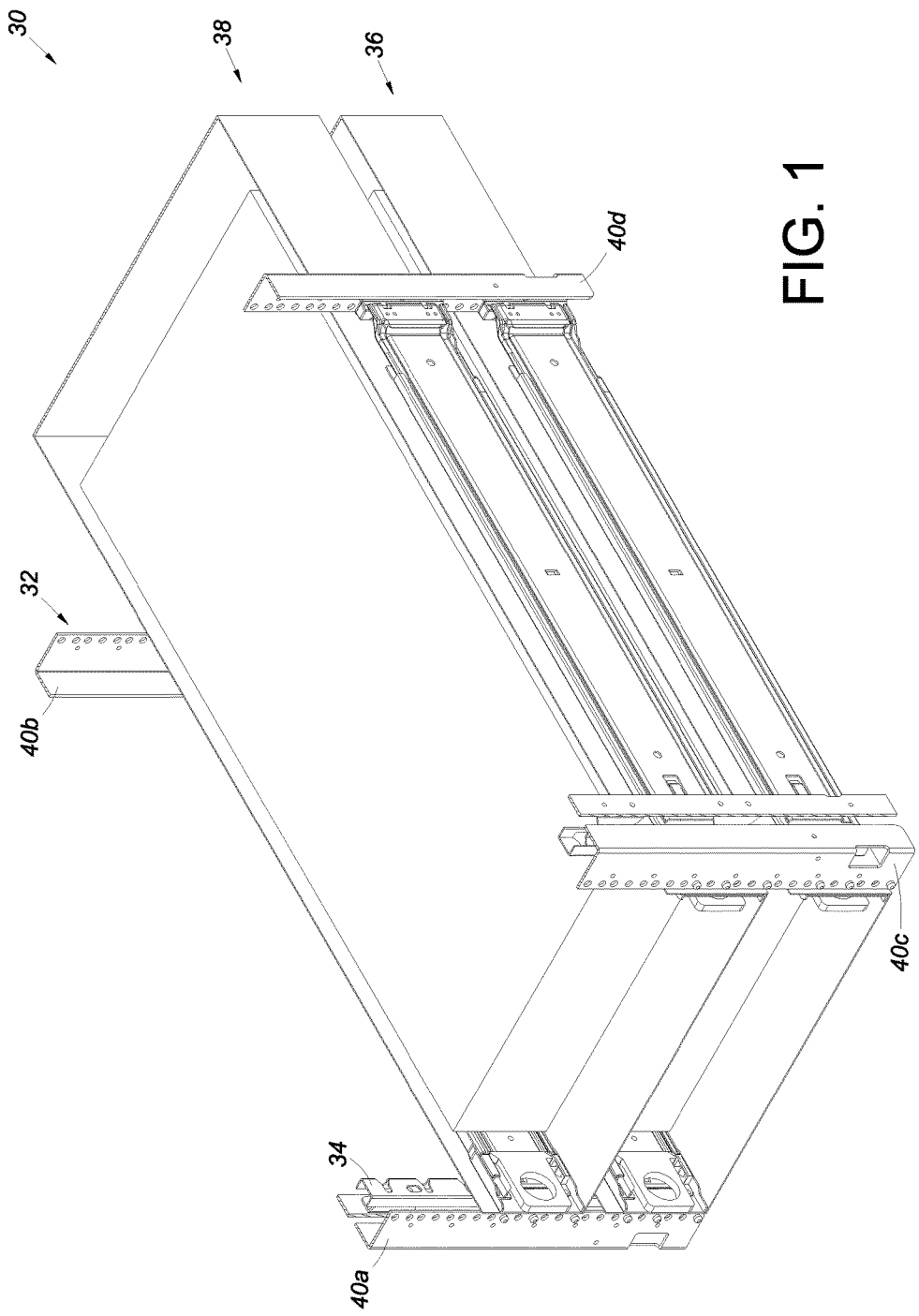
FIG. 1 is a perspective view in which the slide rail assembly with an interlock device in the first embodiment of the present invention is applied to a rack system.

Referring to FIG. 1, a rack system 30 according to an embodiment of the present invention includes a rack 32, a linking member 34, and at least one piece of equipment, such as first equipment 36 and second equipment 38. The rack 32 includes a plurality of posts 40a, 40b, 40c, and 40d. The linking member 34 is provided adjacent to one of the posts 40a, 40b, 40c, and 40d of the rack 32.

Figure 2:
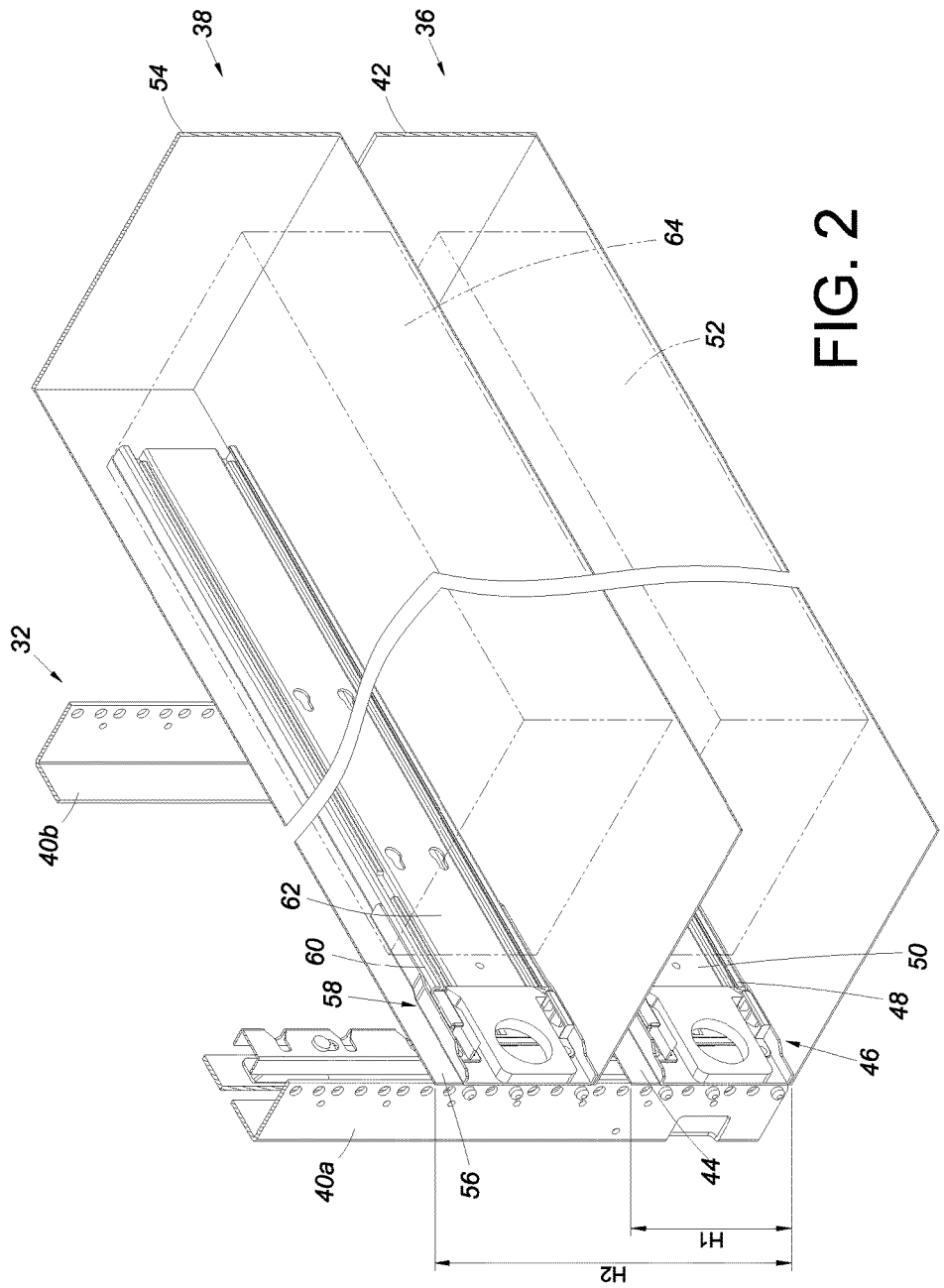
FIG. 2 is another perspective view showing the slide rail assembly with an interlock device in the first embodiment of the present invention applied to a rack system.

As shown in FIG. 2, the first equipment 36 includes a first chassis 42 and a first slide rail assembly 46. The first chassis 42 has a first wall 44 arranged between the two posts 40a and 40b of the rack 32 and located at a first height H1. The first slide rail assembly 46 is mounted on the first wall 44 and includes a first rail 48 and a second rail 50. The second rail 50 can be displaced with respect to the first rail 48 and is configured to carry a first object 52 so that the first object 52 can be displaced with respect to the first chassis 42. The second equipment 38 includes a second chassis 54 and a second slide rail assembly 58. The second chassis 54 has a second wall 56 arranged between the two posts 40a and 40b of the rack 32 and located at a second height H2. The second height H2 is greater than the first height H1. The second slide rail assembly 58 is mounted on the second wall 56 and includes a first rail 60 and a second rail 62. The second rail 62 can be displaced with respect to the first rail 60 and is configured to carry a second object 64 so that the second object 64 can be displaced with respect to the second chassis 54. In this embodiment, the first equipment 36 and the second equipment 38 have substantially the same structural arrangement.

Figure 3:
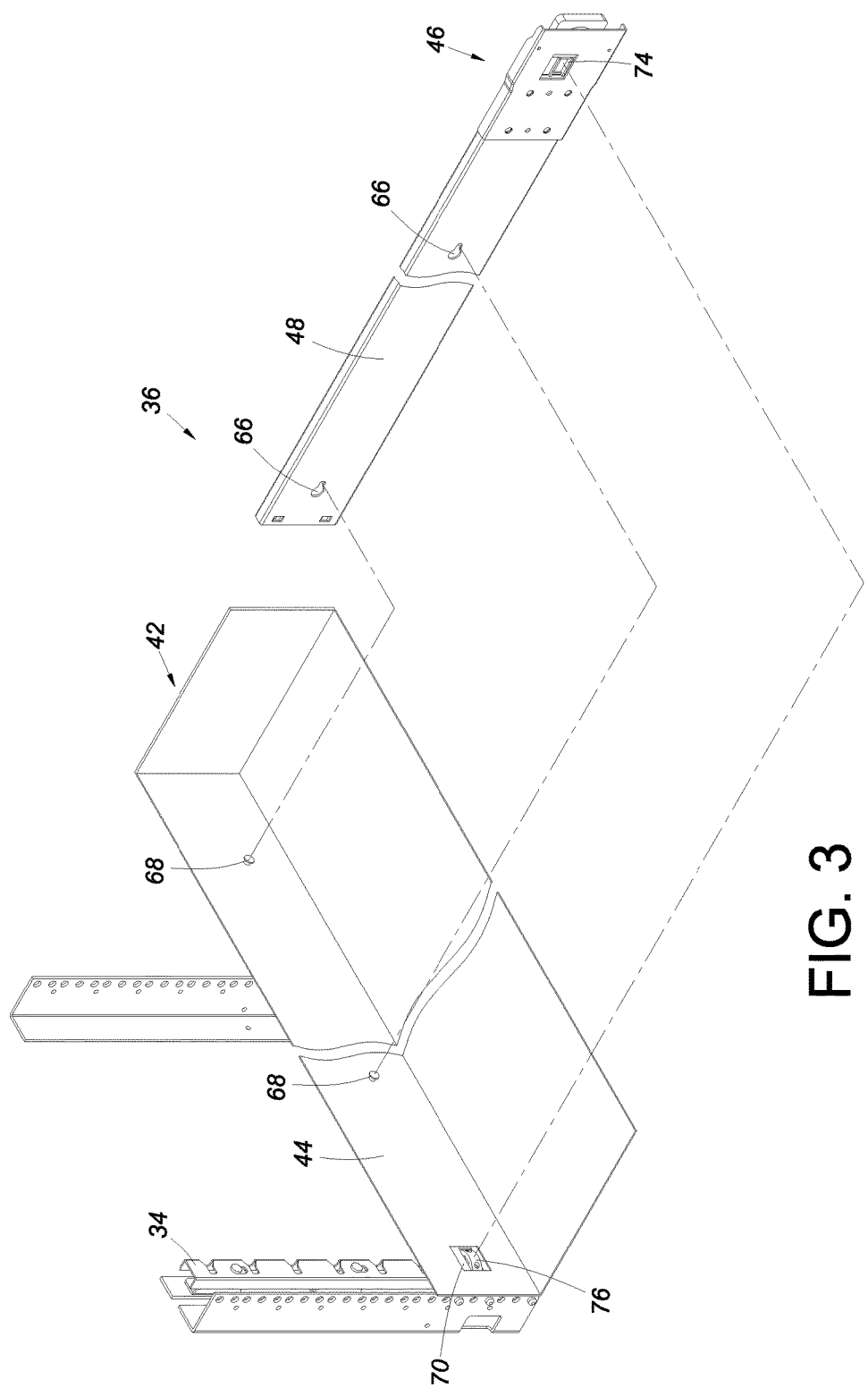
FIG. 3 is an exploded view showing how the first slide rail assembly of the first equipment in the first embodiment of the present invention is mounted to the first wall.
Figure 4:
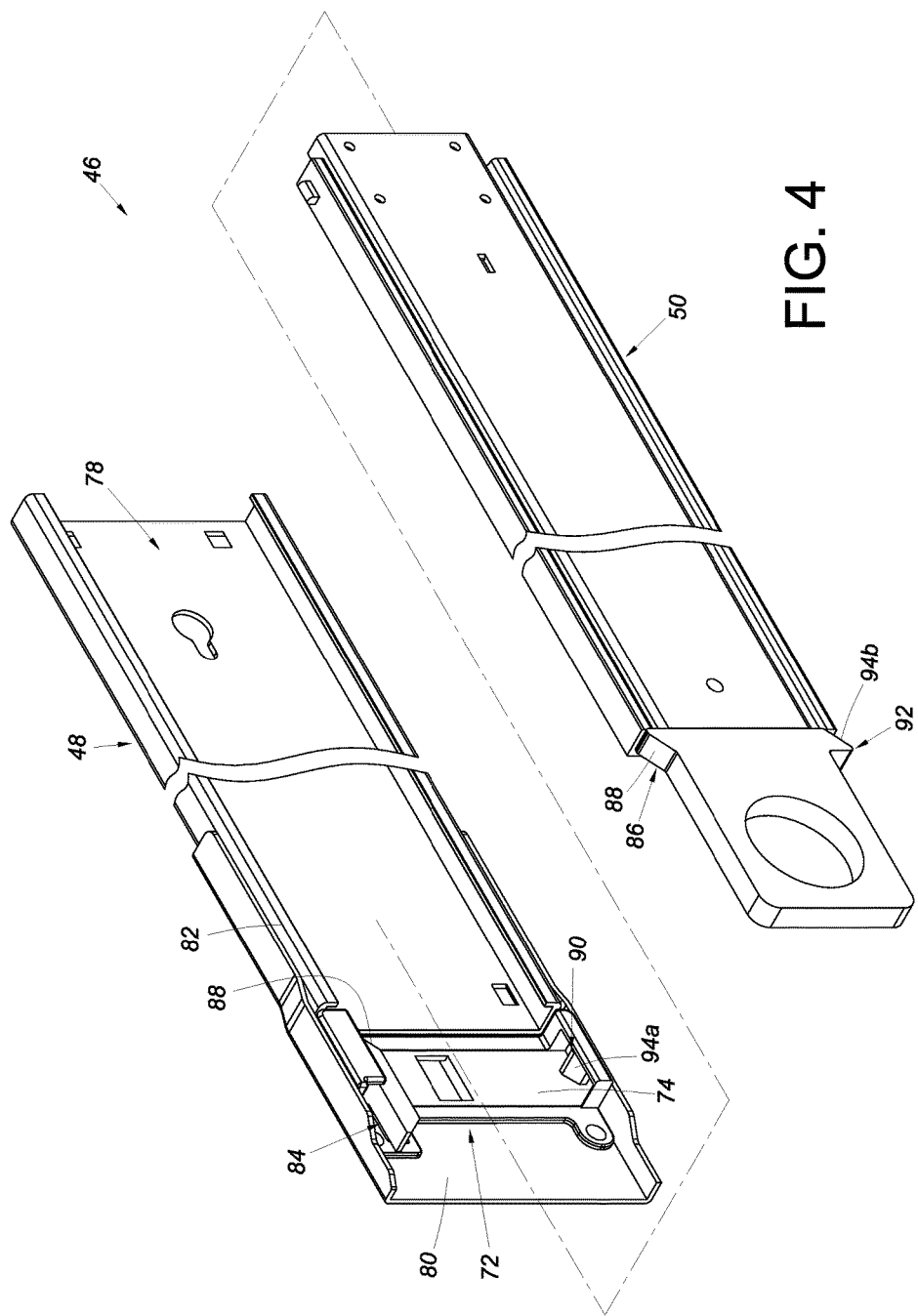
FIG. 4 is an exploded view of the first rail and the second rail of the first slide rail assembly in the first embodiment of the present invention.

Referring to FIG. 3 and FIG. 4, the first rail 48 of the first slide rail assembly 46 of the first equipment 36 has at least one first mounting feature 66, and the first wall 44 of the first chassis 42 has at least one second mounting feature 68. The first rail 48 of the first slide rail assembly 46 is mounted to the first wall 44 of the first chassis 4 via the at least one first mounting feature 66 and the at least one second mounting feature 68. The first wall 44 has a first opening 70. The first equipment 36 further includes a first interlock device 72 which is provided between the first slide rail assembly 46 and the linking member 34 through the first opening 70. More specifically, the first interlock device 72 includes a first locking member 74 and a first engaging member 76. The first locking member 74 is movably connected to the first rail 48 of the first slide rail assembly 46. The first engaging member 76 is configured to extend through the first opening 70 and be provided between the first locking member 74 and the linking member 34.

FIG. 4 further shows that the first rail 48 of the first slide rail assembly 46 has a channel 78. The first slide rail assembly 46 also includes a supporting frame 80 connected to the first rail 48 at a position adjacent to an end portion 82 of the first rail 48 such that the supporting frame 80 can be viewed as a part of the first rail 48. The first locking member 74 of the first interlock device 72 is movably connected to the supporting frame 80. The second rail 50 is movably mounted in the channel 78 of the first rail 48. Preferably, one of the first locking member 74 of the first interlock device 72 and the second rail 50 of the first slide rail assembly 46 includes a guiding portion. In this embodiment for example, the first locking member 74 includes at least one first guiding portion 84, the second rail 50 includes at least one second guiding portion 86, and each of the at least one first guiding portion 84 and the at least one second guiding portion 86 has an inclined section 88.

Besides, the first locking member 74 of the first interlock device 72 has a blocking portion 90, and the second rail 50 of the first slide rail assembly 46 has a disengaging portion 92. The blocking portion 90 has a disengaging surface 94a while the disengaging portion 92 has a disengaging surface 94b. In this embodiment, the two disengaging surfaces 94a and 94b are inclined surfaces by way of example.

Figure 5:
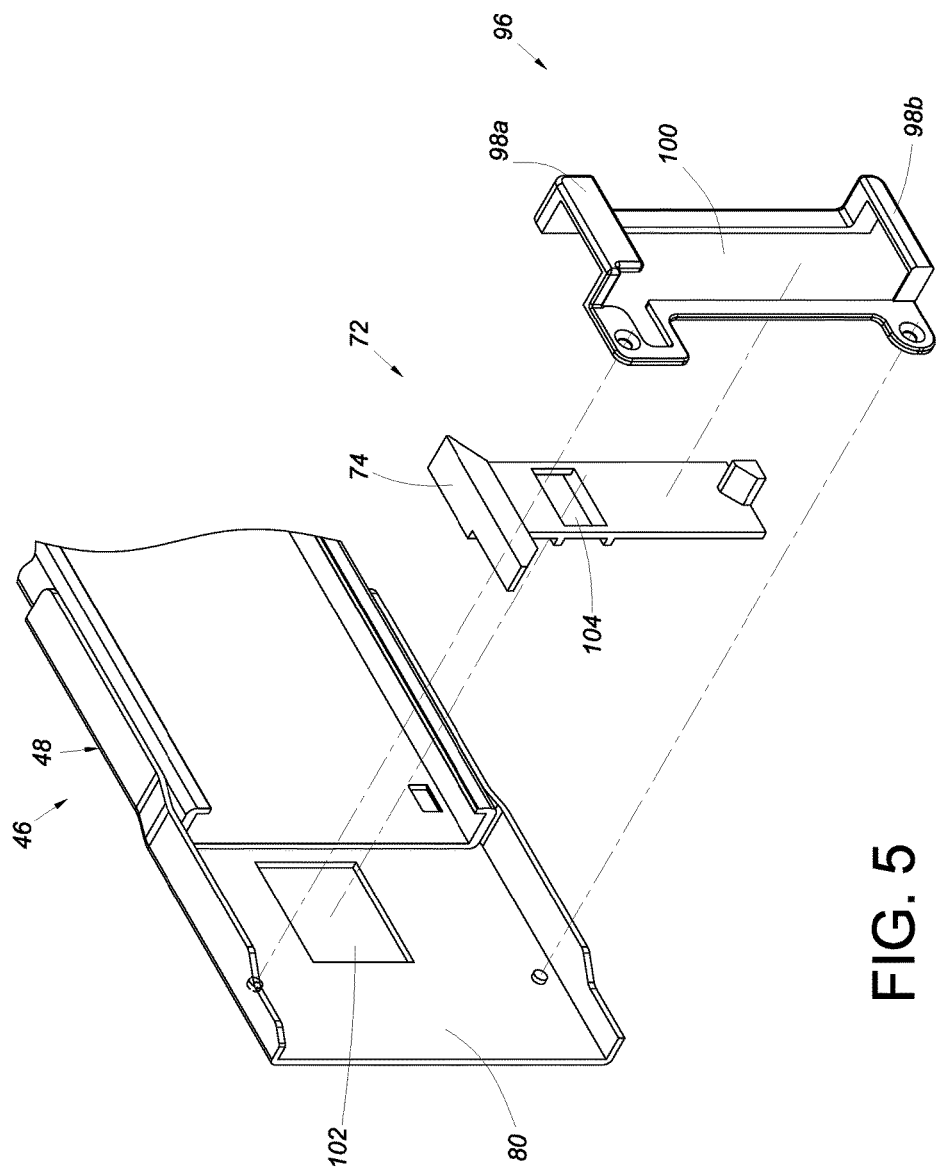
FIG. 5 is an exploded view of the first rail, the first locking member, and the seat member of the first slide rail assembly in the first embodiment of the present invention.

In addition, referring to FIG. 5, a seat member 96 is mounted to the supporting frame 80 of the first rail 48 of the first slide rail assembly 46, and the first locking member 74 of the first interlock device 72 is movably mounted between the supporting frame 80 and the seat member 96. In this embodiment, the seat member 96 includes at least two wall portions 98a and 98b. The at least two wall portions 98a and 98b form a space 100 therebetween through which the first locking member 74 can be moved. Moreover, the supporting frame 80 has a second opening 102, and the first locking member 74 of the first interlock device 72 has a mounting hole 104 which corresponds to the second opening 102 and through which the first engaging member 76 of the first interlock device 72 can be inserted.

Figure 6:
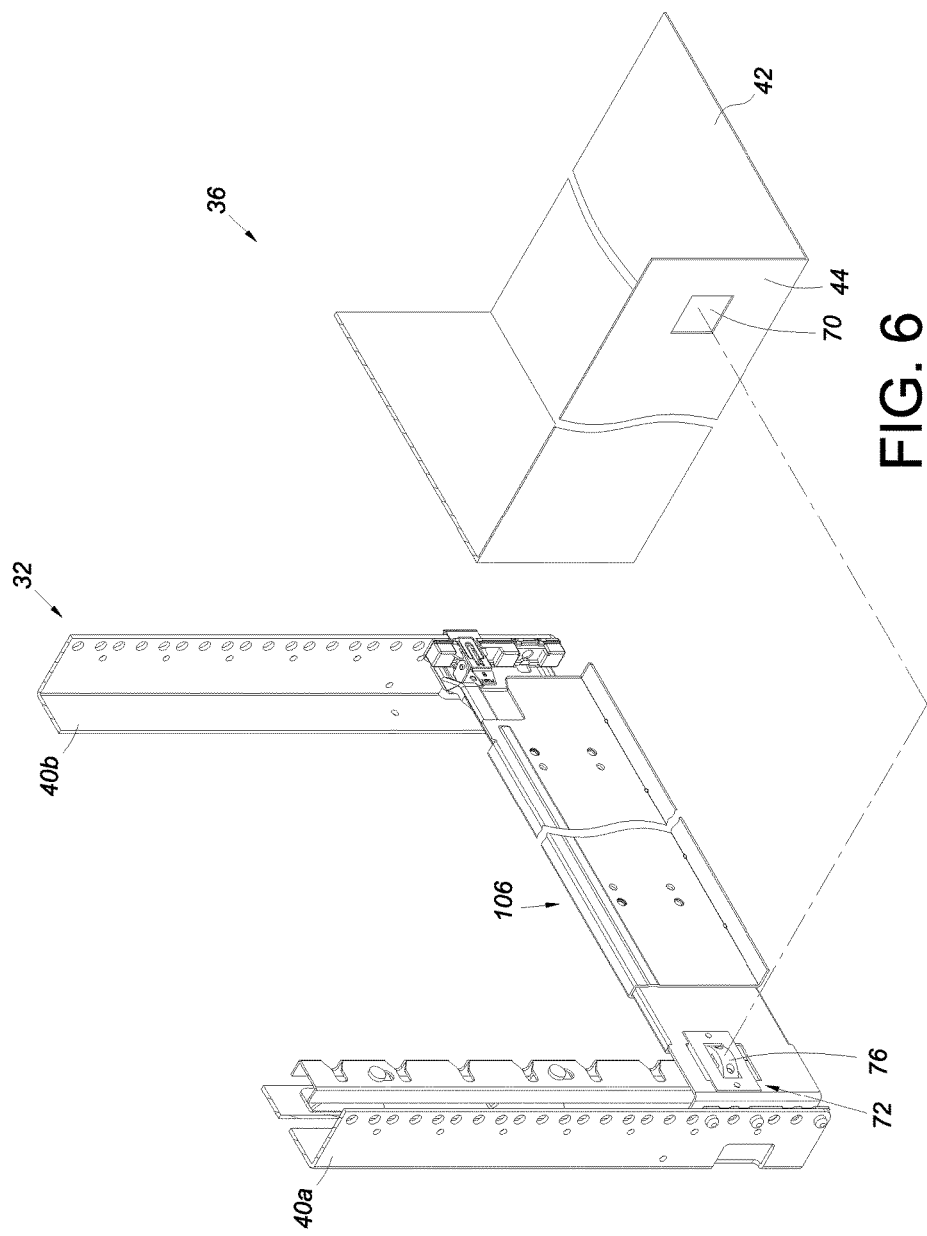
FIG. 6 is an exploded view showing how the first equipment in the first embodiment of the present invention is mounted to a rack via the supporting rail.

As shown in FIG. 6, the first wall 44 of the first chassis 42 of the first equipment 36 is to be connected between the two posts 40a and 40b of the rack 32 via a supporting rail 106. The first engaging member 76 of the first interlock device 72 can extend through the first opening 70 in the first wall 44 of the first chassis 42.

Figure 7:
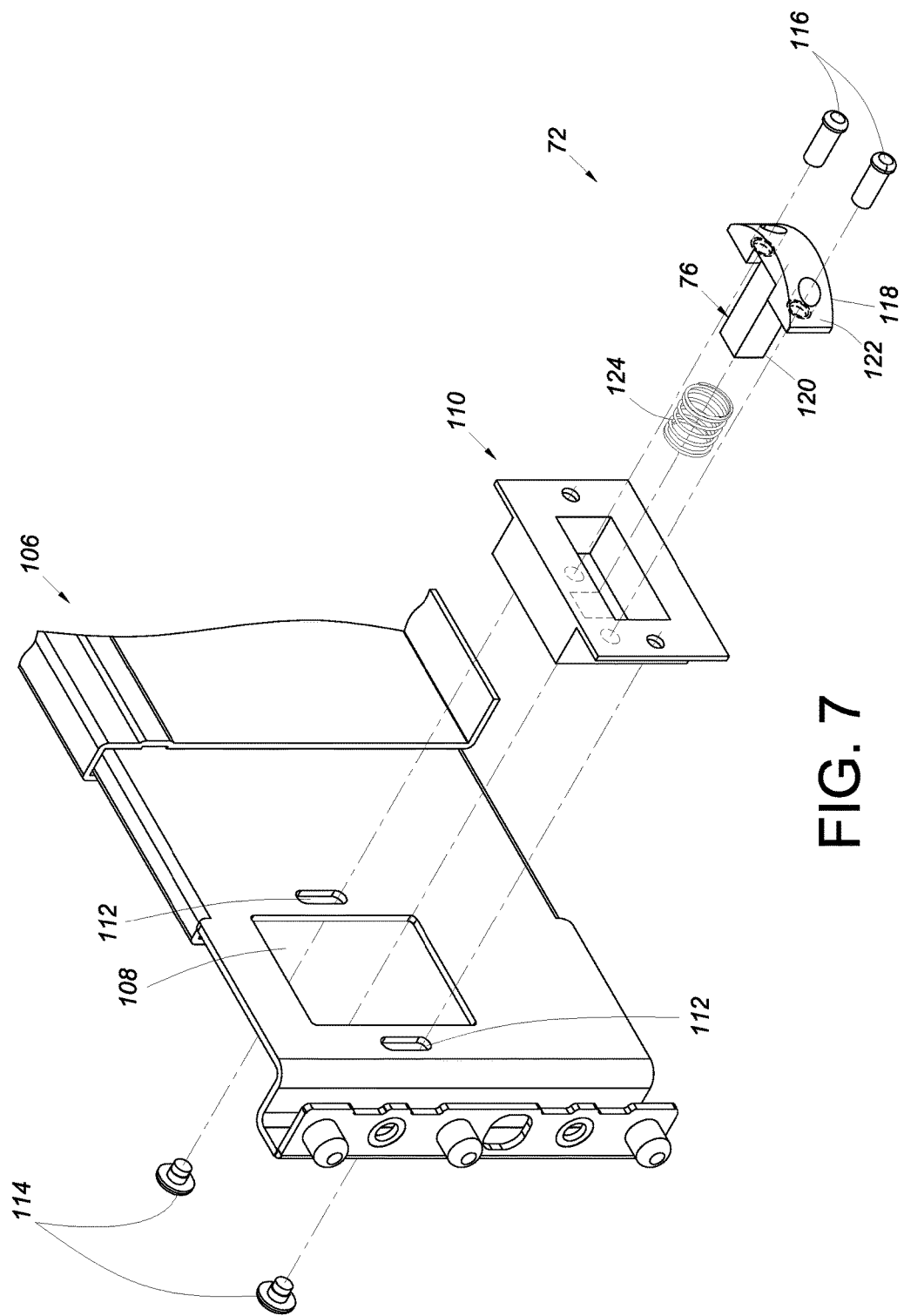
FIG. 7 is an exploded view showing how the first engaging member of the first interlock device in the first embodiment of the present invention is mounted to the supporting rail.

As shown in FIG. 7, the supporting rail 106 has a third opening 108. The first engaging member 76 of the first interlock device 72 is movably mounted to the supporting rail 106 via a mount 110. For example, one of the mount 110 and the supporting rail 106 has at least one guiding feature 112 such as a slot, and the mount 110 is movably mounted to the supporting rail 106 by at least one connecting feature 114 extending through a portion of the at least one guiding feature 112. The first engaging member 76 of the first interlock device 72 can be arranged to the mount 110 via at least one supporting feature 116. The first engaging member 76 includes a first portion 118 and a second portion 120 connected to the first portion 118. The first portion 118 has at least one guiding section 122 such as a curved surface, and the second portion 120 extends through the mount 110 and the third opening 108 of the supporting rail 106. Preferably, an elastic member 124 is further provided, such as a spring mounted between the mount 110 and the second portion 120 of the first engaging member 76.

Figure 8:
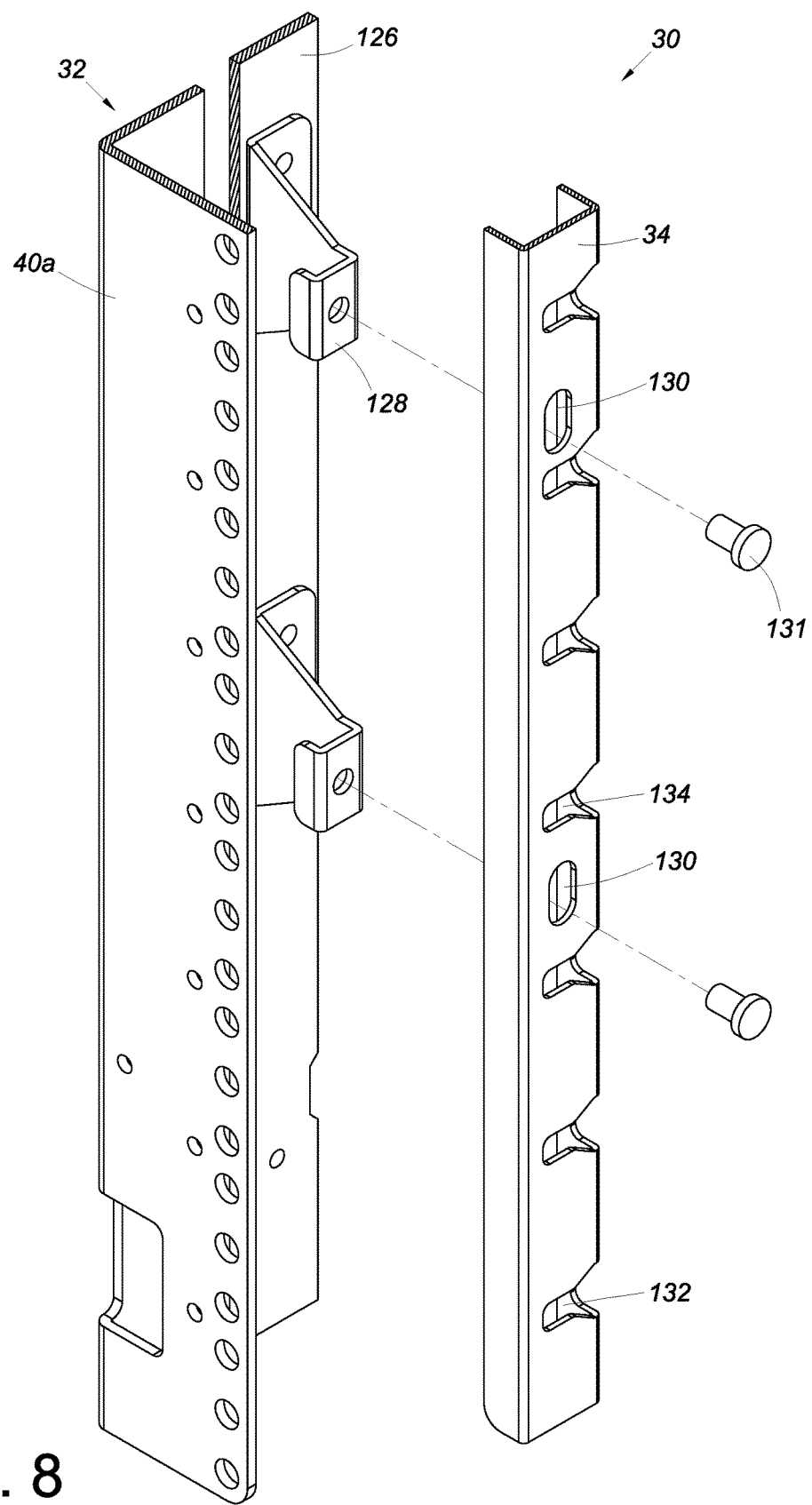
FIG. 8 is an exploded view of the linking member and the auxiliary frame of the rack system in the first embodiment of the present invention.

As shown in FIG. 8, the rack system 30 further includes an auxiliary frame 126 and at least one mounting member 128 connected to the auxiliary frame 126. In this embodiment, the auxiliary frame 126 is located adjacent to the post 40a of the rack 32, and the linking member 34 is movably mounted on the auxiliary frame 126. One of the at least one mounting member 128 and the linking member 34 has at least one guide hole 130. The linking member 34 is movably mounted to the auxiliary frame 126 by at least one connecting member 131 extending through a portion of the guide hole 130. Preferably, the linking member 34 has a plurality of features such as a first feature 132 and a second feature 134. The first feature 132 and the second features 134 can be holes, grooves, or recessed structures and are holes in this embodiment by way of example.

As shown in FIG. 9, the second portion 120 of the first engaging member 76 is inserted through the first feature 132 of the linking member 34. To assemble the first equipment 36 to the rack 32, the first equipment 36 is displaced in a first direction D1.

During displacement in the first direction D1, referring to FIG. 10, the first wall 44 of the first chassis 42 of the first equipment 36 is guided by the at least one guiding section 122 of the first engaging member 76 to push and thus displace the first engaging member 76. The elastic member 124 generates and stores an elastic force in response to displacement of the first engaging member 76.

Figure 11A:
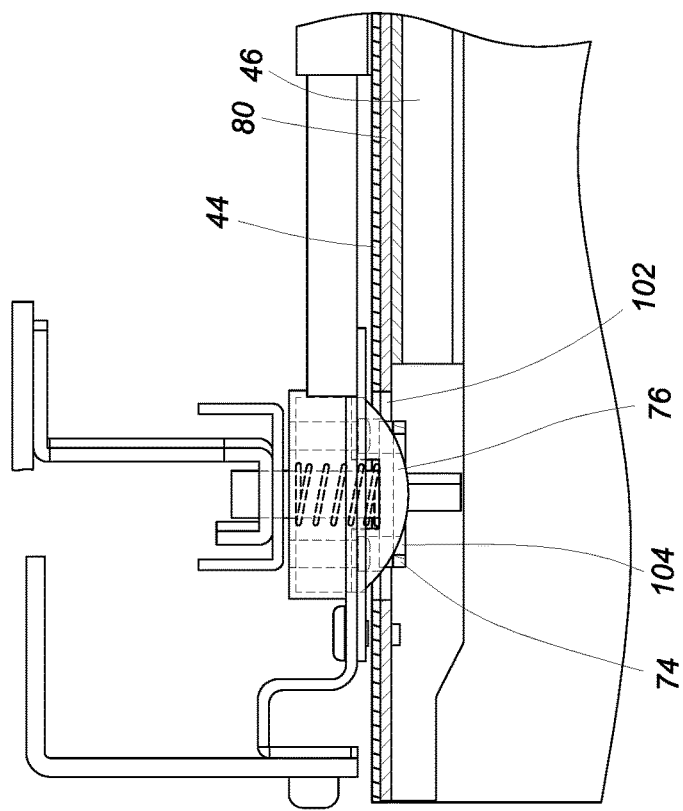
FIG. 11A shows that, after the first chassis in FIG. 10 is mounted to the supporting rail, the first engaging member further extends through the second opening of the supporting frame and is thus mounted in the mounting hole in the first locking member.
Figure 11:
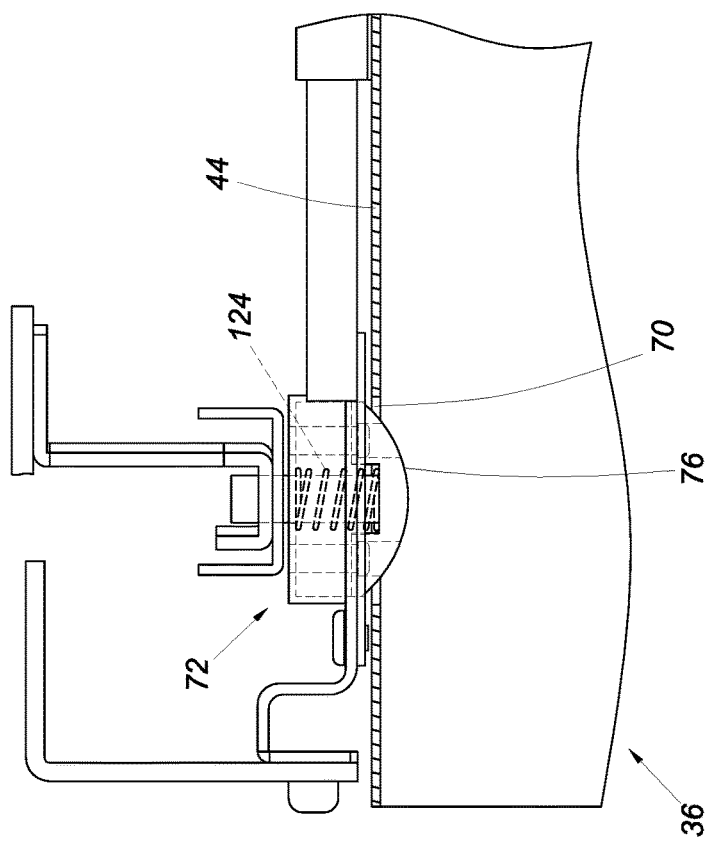
FIG. 11 shows how the first chassis in FIG. 10 is mounted to the supporting rail and causes the first engaging member to extend through the first opening.

During further displacement in the first direction D1, as shown in FIG. 10 and FIG. 11, the first opening 70 in the first wall 44 of the first equipment 36 will correspond to the first engaging member 76 of the first interlock device 72 such that the first engaging member 76 extends through the first opening 70 of the first wall 44 in response to the elastic force of the elastic member 124.

Once the first slide rail assembly 46 is mounted on the first wall 44, as shown in FIG. 11A, the first engaging member 76 further extends through the second opening 102 of the supporting frame 80 and is thus mounted in the mounting hole 104 of the first locking member 74.

Figure 12:
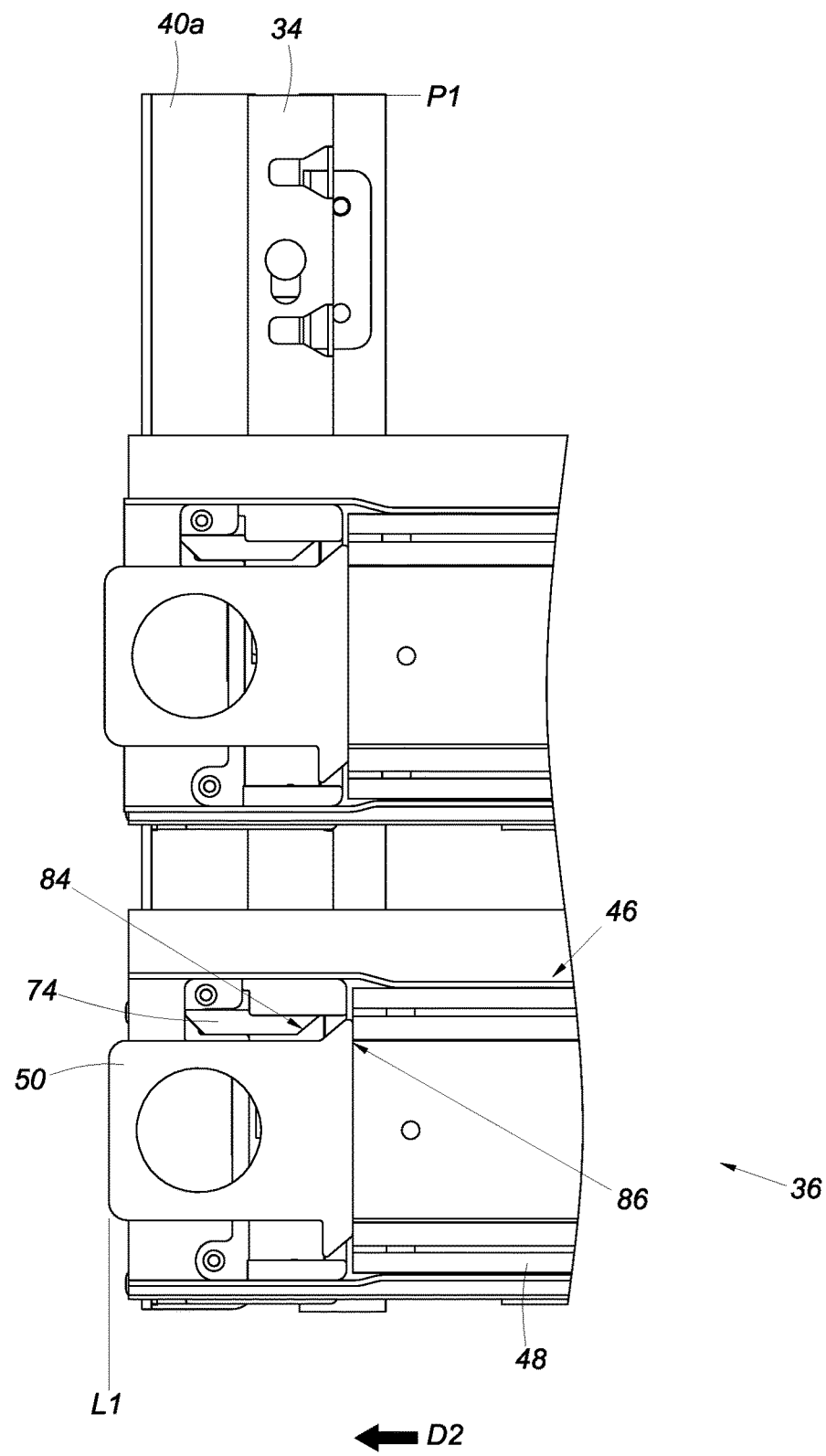
FIG. 12 shows the rack system in the first embodiment of the present invention.
Figure 13:
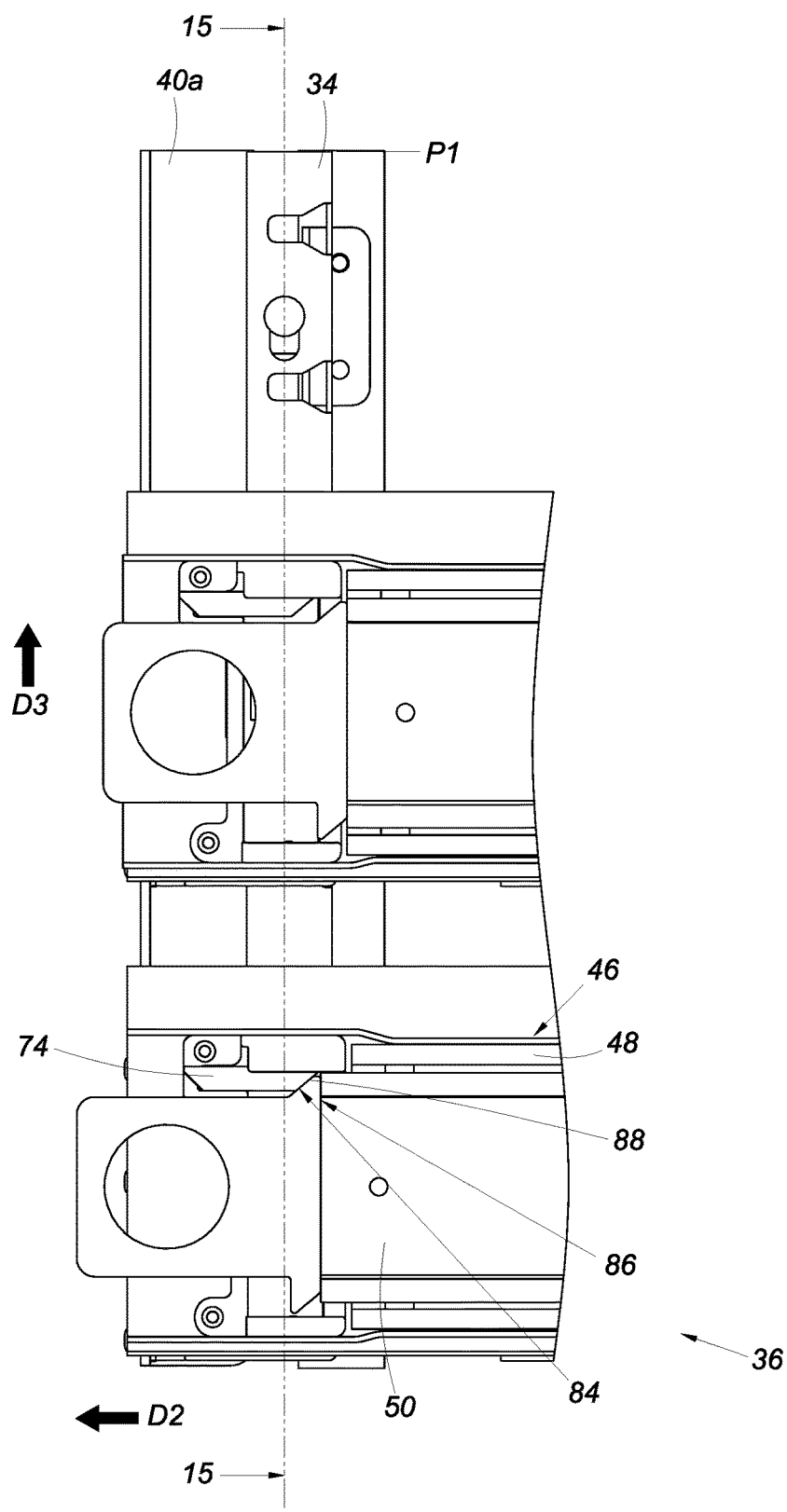
FIG. 13 shows how the second rail of the first slide rail assembly in FIG. 12 is displaced in the second direction, with the linking member staying at a first position.

In FIG. 12 and FIG. 13, the linking member 34 is at a first position P1 with respect to the post 40a. The second rail 50 of the first slide rail assembly 46 of the first equipment 36 is displaced in a second direction D2, such as an opening direction, from a retracted position L1 with respect to the first rail 48. In the process, the inclined section 88 of the second guiding portion 86 of the second rail 50 is pressed against the inclined section 88 of the first guiding portion 84 of the first locking member 74 and thereby pushes the first locking member 74.

Figure 14:
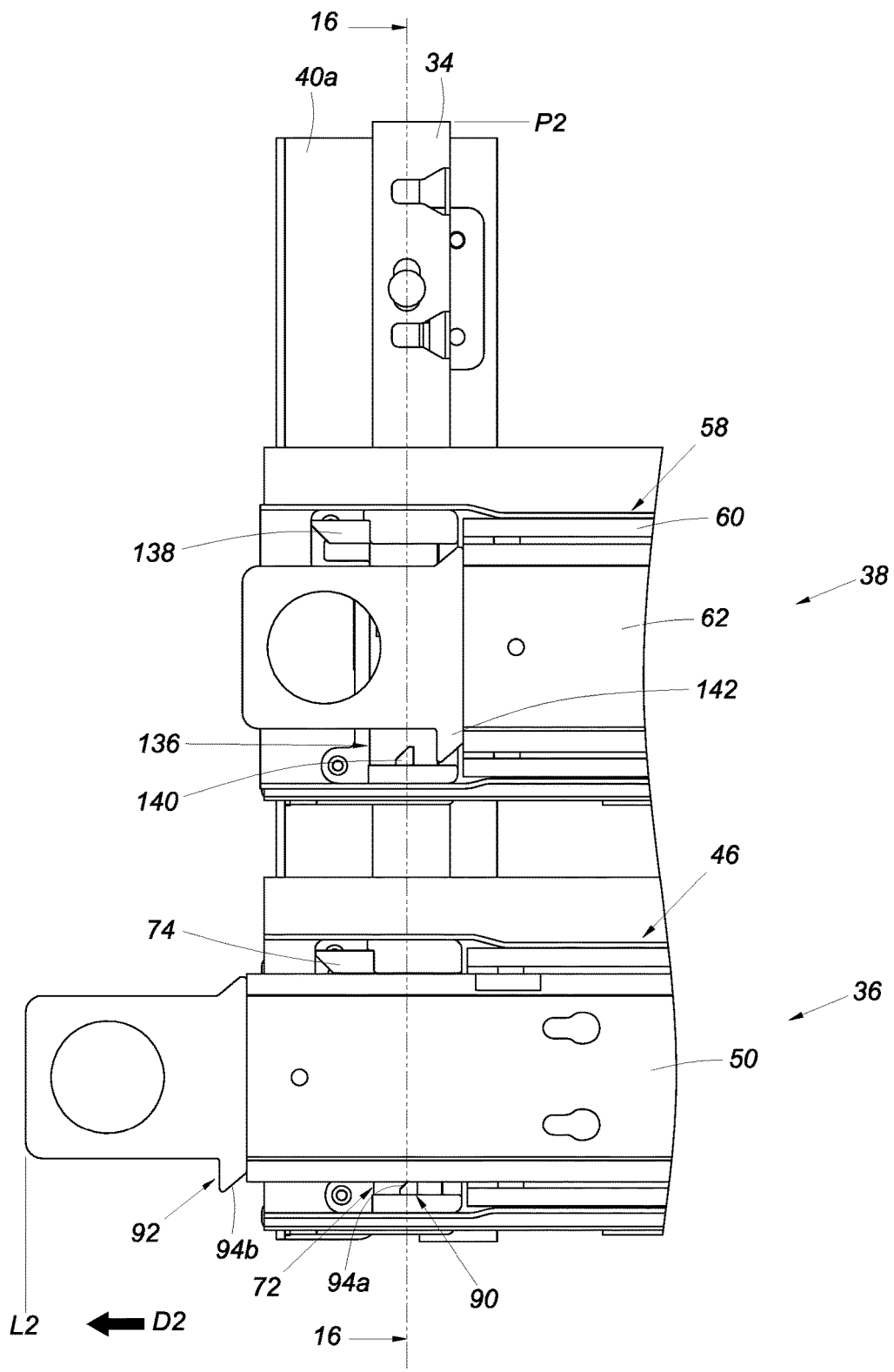
FIG. 14 shows how the second rail of the first slide rail assembly in FIG. 13 is further displaced in the second direction such that the second rail of the second slide rail assembly is blocked.

Referring to FIG. 13 and FIG. 14, the second rail 50 of the first slide rail assembly 46 is further displaced in the second direction D2 and reaches a predetermined position L2. During the process, the second rail 50 of the first slide rail assembly 46 displaces the first locking member 74 of the first interlock device 72 in a third direction D3. In turn, the first locking member 74 drives the first engaging member 76, and the first engaging member 76 drives the linking member 34 into displacement in the third direction D3 (see FIG. 11 and FIG. 11A for the linkage therebetween). Consequently, the linking member 34 is displaced from the first position P1 to a second position P2 with respect to the post 40a. As previously mentioned, the first equipment 36 and the second equipment 38 have substantially the same structural arrangement, so the linking member 34 will also displace the second locking member 138 of the second interlock device 136 of the second equipment 38 in the third direction D3, thereby blocking a moving path of the second rail 62 of the second slide rail assembly 58 (as described in more detail below with reference to FIG. 15 and FIG. 16). For example, the second locking member 138 of the second interlock device 136 has a blocking portion 140 for blocking a disengaging portion 142 of the second rail 62 of the second slide rail assembly 58 so that the second interlock device 136 can block the second rail 62 of the second slide rail assembly 58 with the blocking portion 140 in response to displacement of the linking member 34 from the first position P1 to the second position P2, with a view to limiting the movement of the second rail 62 of the second slide rail assembly 58 with respect to the first rail 60 in the second direction D2.

It is worth mentioning that, when displaced in the first direction opposite the second direction D2, the second rail 50 of the first slide rail assembly 46 can drive the first locking 74 of the first interlock device 72 and thereby displace the linking member 34 from the second position P2 to the first position P1, thanks to the disengaging surface 94b of the disengaging portion 92 of the second rail 50 and the disengaging surface 94a of the blocking portion 90 of the first locking member 74 of the first interlock device 72. Thus, the second locking member 138 of the second interlock device 136 will not block the second rail 62 of the second slide rail assembly 58 of the second equipment 38.

Figure 15:
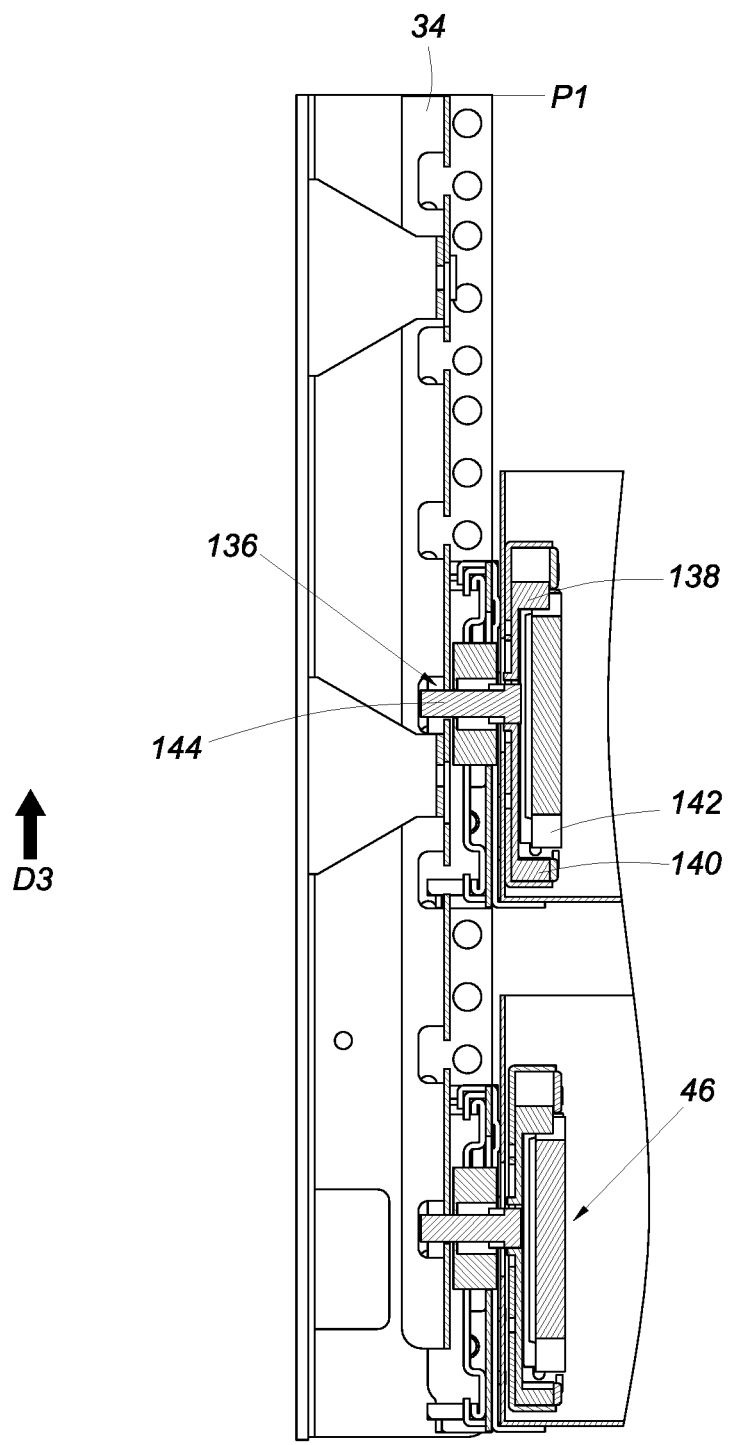
FIG. 15 is a sectional view taken along the line 15-15 in FIG. 13.
Figure 16:
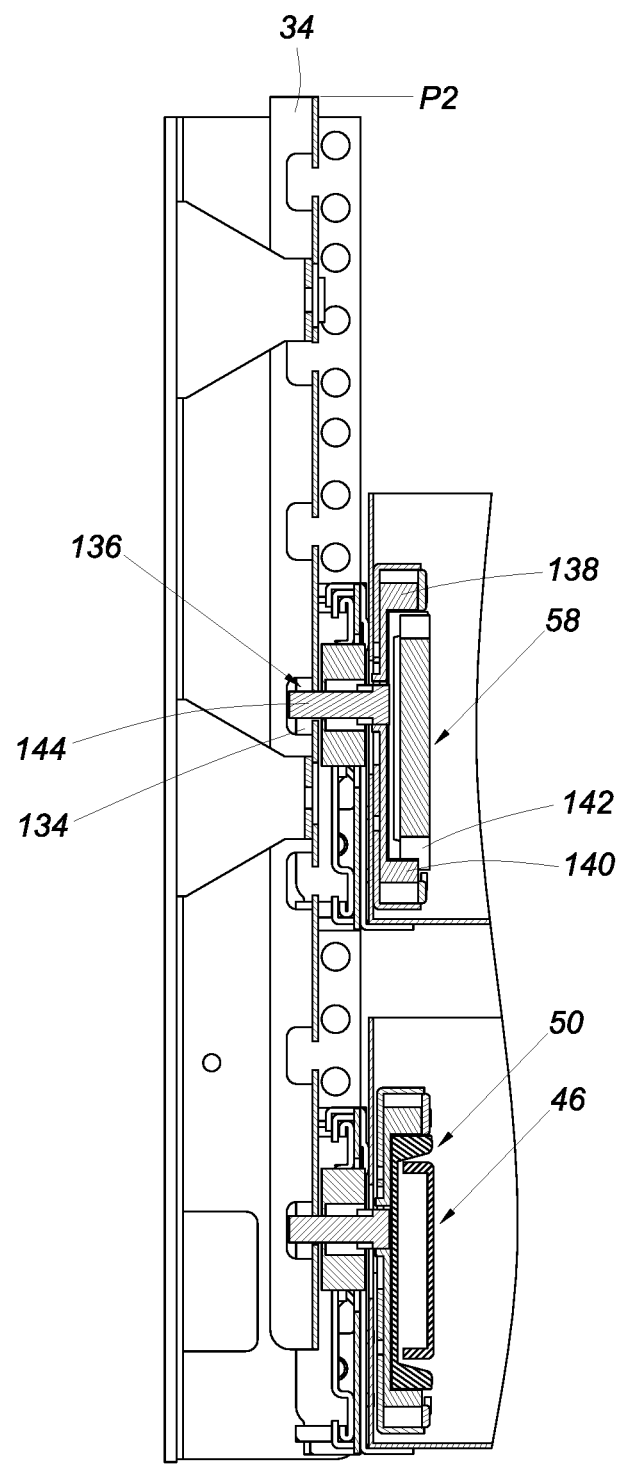
FIG. 16 is a sectional view taken along the line 16-16 in FIG. 14.

Referring to FIG. 15 and FIG. 16, in the course in which the second rail 50 of the first slide rail assembly 46 is displaced from the retracted position L1 to the second direction D2, the linking member 34 is displaced from the first position P1 to the second position P2. As a result, the second engaging member 144 of the second interlock device 136 (the second engaging member 144 being inserted through the second feature 134 of the linking member 34) is displaced in the third direction D3 along with the linking member 34 and drives the second locking member 138 of the second interlock device 136 in order for the blocking portion 140 of the second locking member 138 of the second interlock device 136 to block the disengaging portion 142 of the second rail 62 of the second slide rail assembly 58.

Figure 17:
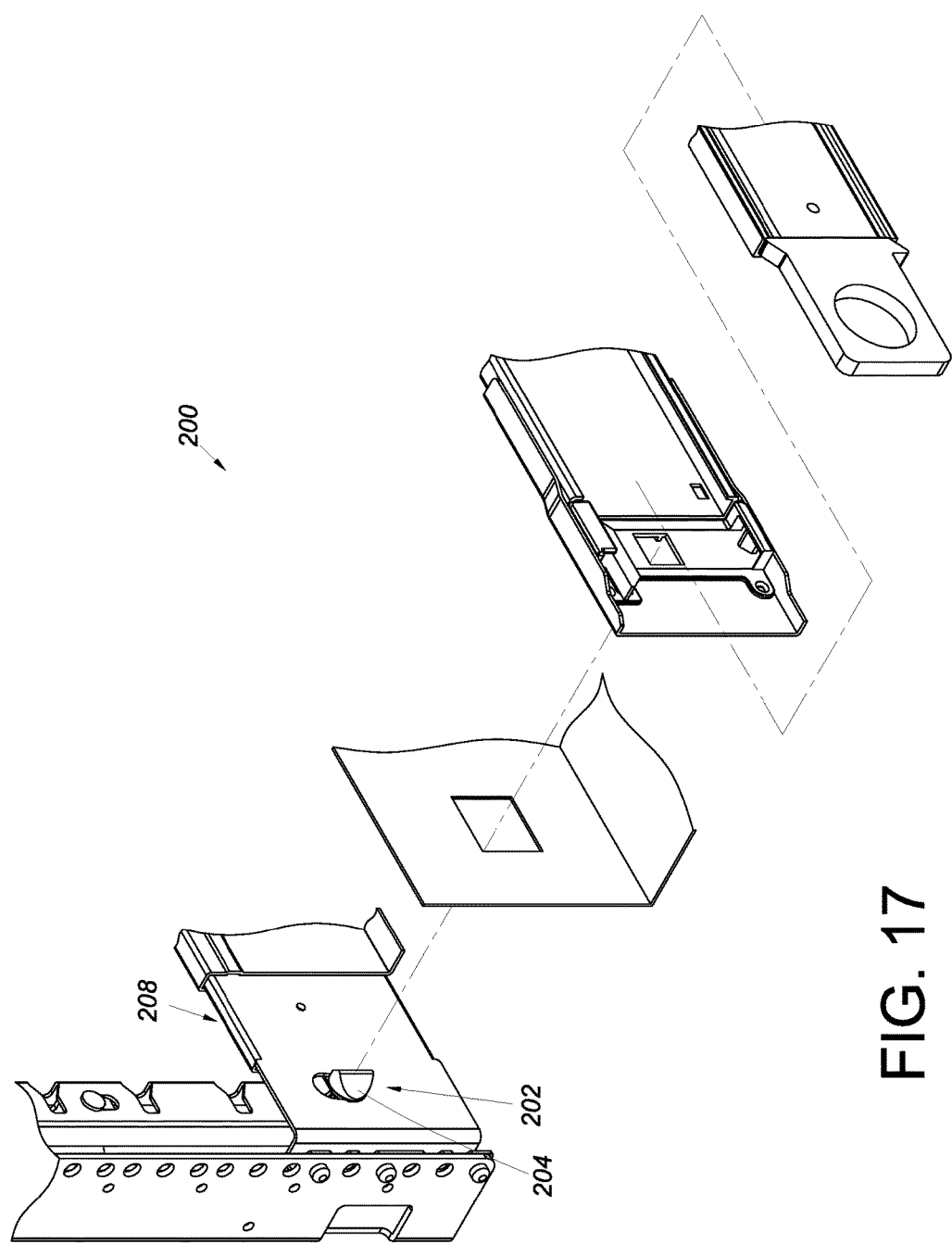
FIG. 17 is a perspective view in which the slide rail assembly with an interlock device in the second embodiment of the present invention is applied to a rack system.
Figure 19:
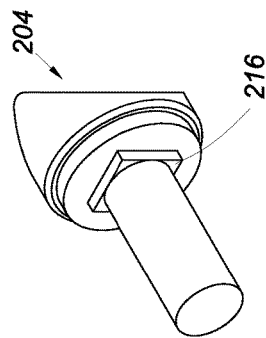
FIG. 19 is a partial view of the first engaging member in FIG. 18.
Figure 18:
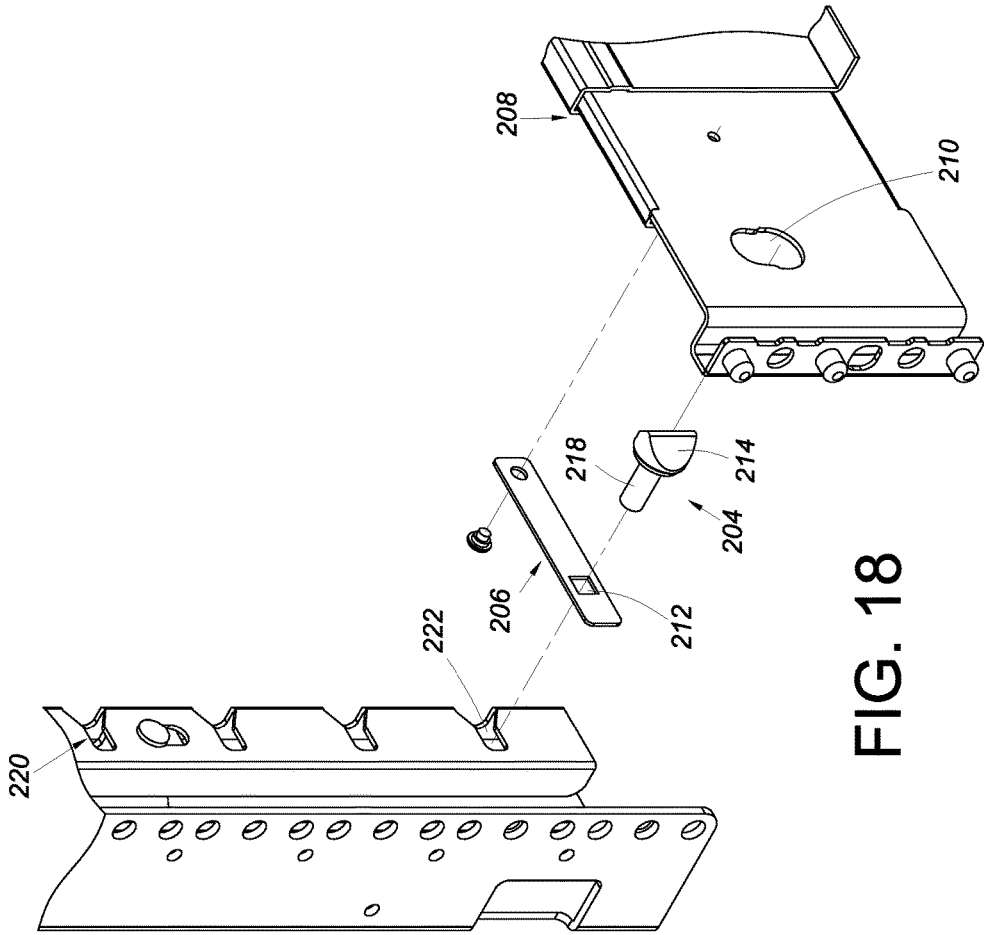
FIG. 18 shows how the first engaging member in the second embodiment of the present invention is mounted between the supporting rail and the linking member via an elastic member.

FIG. 17 and FIG. 18 show the rack system in the second embodiment of the present invention. The second embodiment is different from the first embodiment generally in that the first engaging member 204 of the first interlock device 202 of the first equipment 200 is movably mounted to the supporting rail 208 via an elastic member 206 such as an elastic plate. More specifically, the elastic member 206 is movably connected to the supporting rail 208 and has a hole 212 while the supporting rail 208 has the third opening 210. The first portion 214 of the first engaging member 204 extends through the third opening 210. Referring to FIG. 19, the first engaging member 204 has a projecting section 216 mounted in the hole 212 of the elastic member 206, and the second portion 218 of the first engaging member 204 is inserted through the first feature 222 of the linking member 220.

Figure 21:
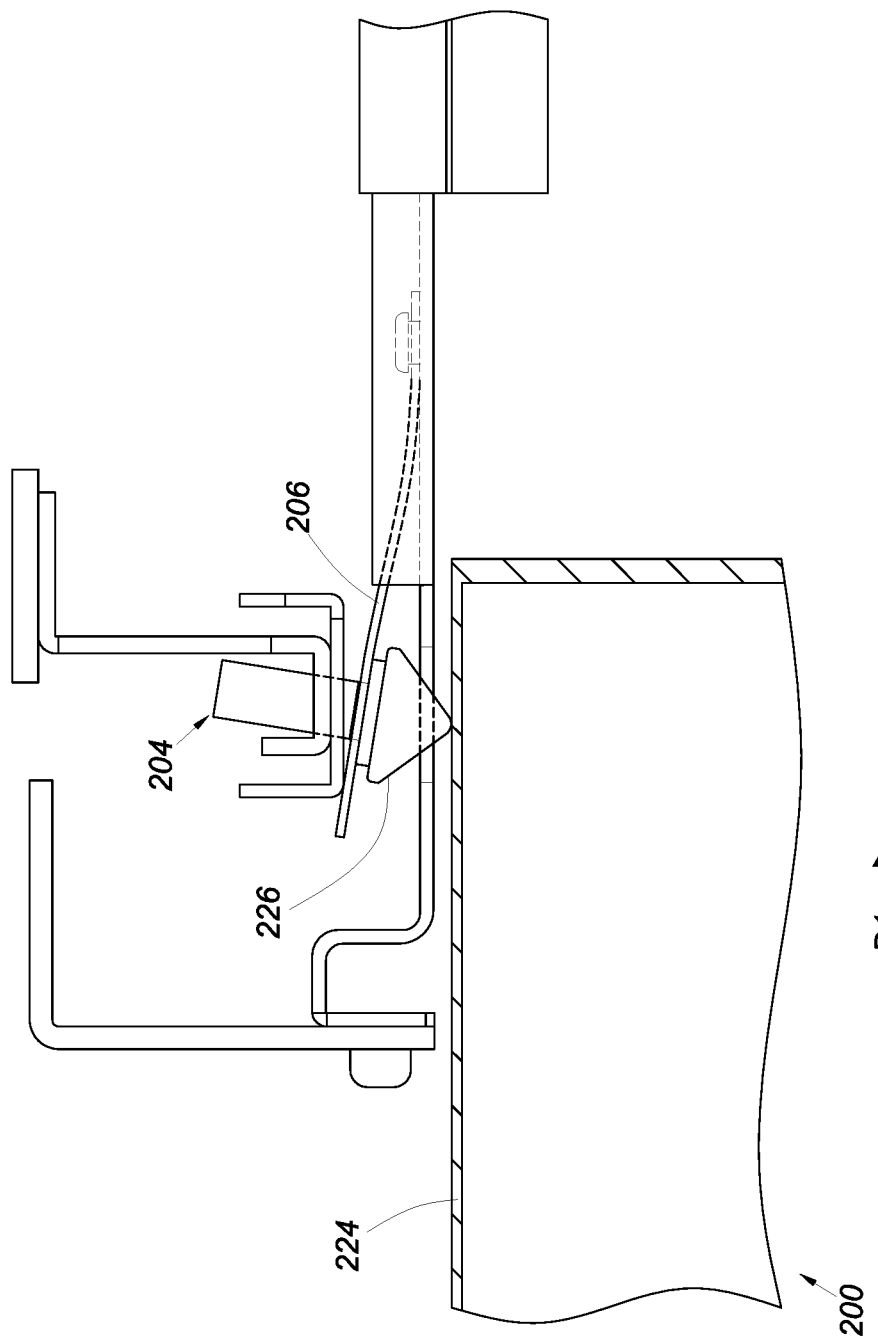
FIG. 21 shows how the first equipment in FIG. 20 is further displaced with respect to the supporting rail in the first direction.

During assembly, referring to FIG. 20 and FIG. 21, the first equipment 200 is displaced in the first direction D1. The first wall 224 of the first equipment 200 is guided by the at least one guiding section 226 (e.g., an inclined surface) of the first engaging member 204 to push and thereby displace the first engaging member 204. The elastic member 206 generates and stores an elastic force in response to displacement of the first engaging member 204.

Figure 22:
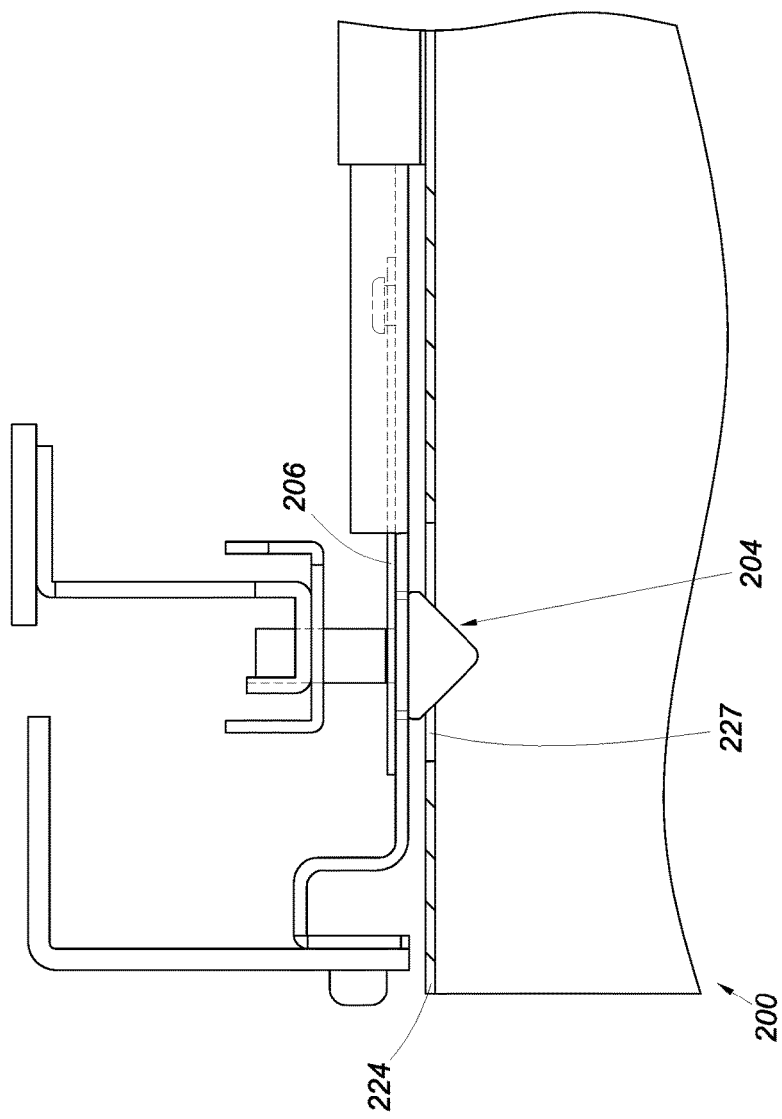
FIG. 22 shows the first equipment in FIG. 21 mounted on the supporting rail.

During continued displacement in the first direction D1, as shown in FIG. 21 and FIG. 22, the first opening 227 in the first wall 224 of the first equipment 200 will correspond to the first engaging member 204 such that the first engaging member 204 extends through the first opening 227 of the first wall 224 in response to the elastic force of the elastic member 206.

Figure 23:
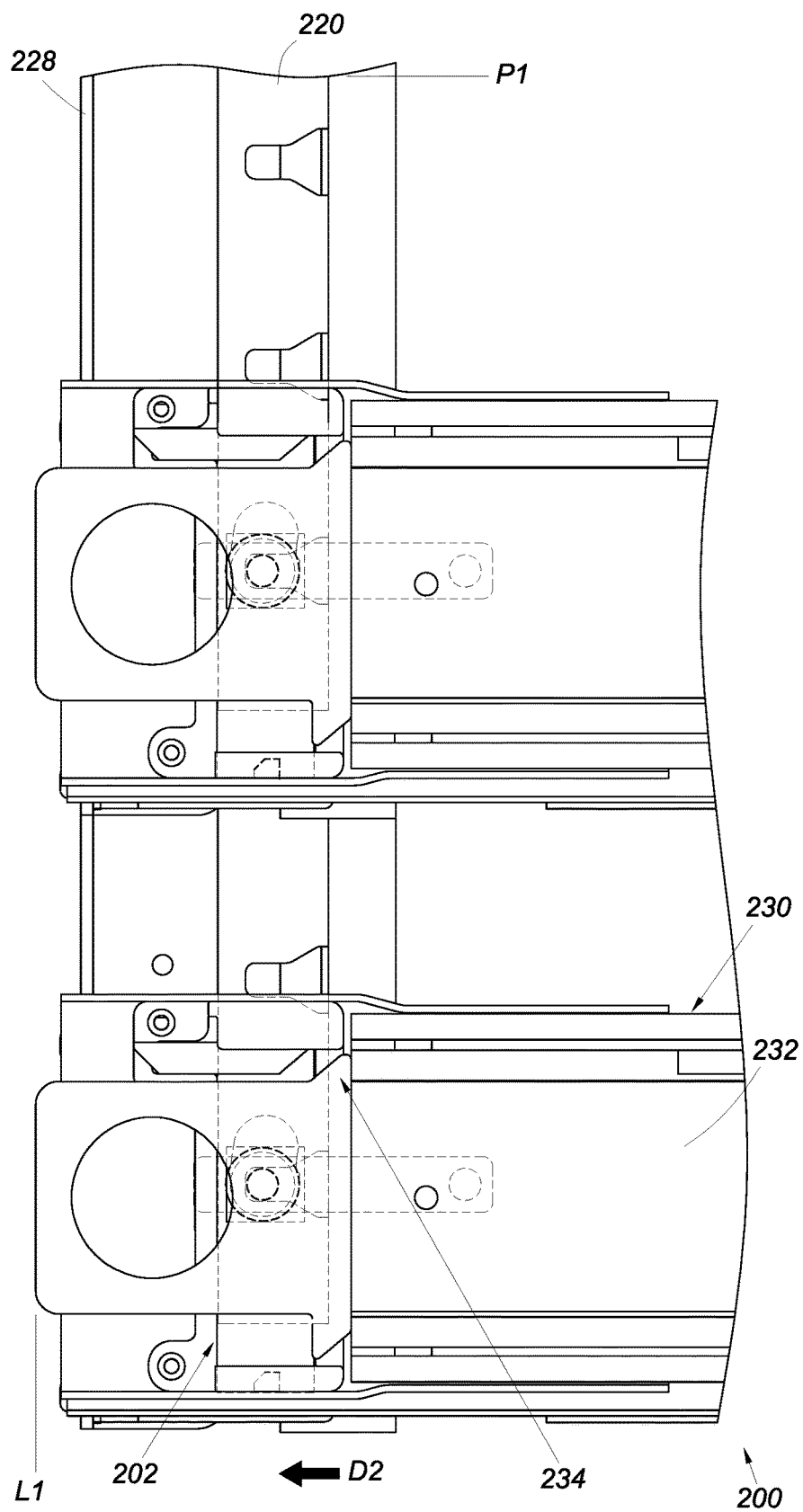
FIG. 23 shows the rack system in the second embodiment of the present invention.
Figure 24:
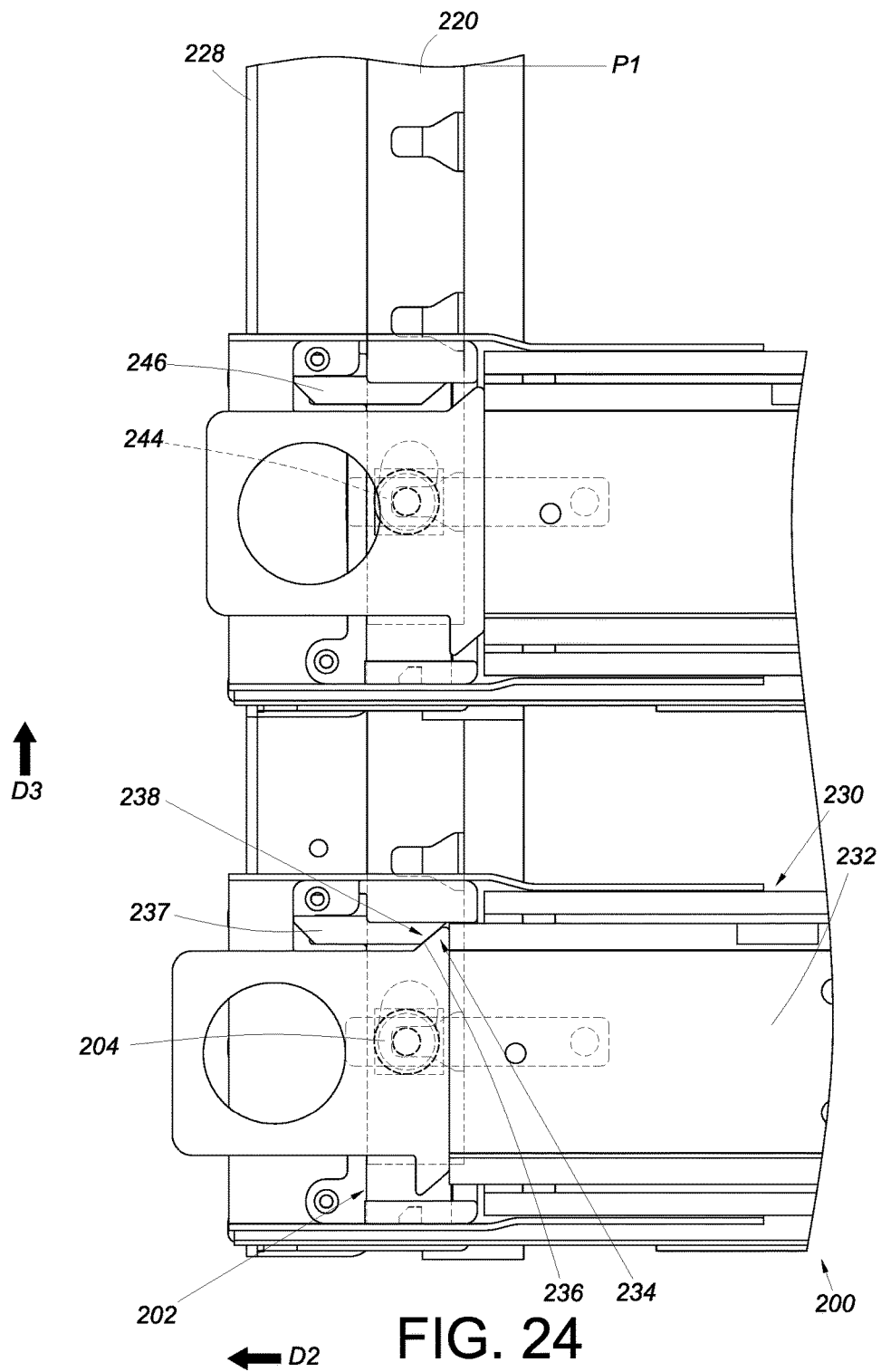
FIG. 24 shows how the second rail of the first slide rail assembly in FIG. 23 is displaced in the second direction, with the linking member staying at a first position.

In FIG. 23 and FIG. 24, the linking member 220 is at the first position P1 with respect to the first post 228. By displacing the second rail 232 of the first slide rail assembly 230 of the first equipment 200 from the retracted position L1 to the second direction D2, the inclined section 236 of the second guiding portion 234 of the second rail 232 is pressed against the first guiding portion 238 of the first locking member 237 of the first interlock device 202.

Figure 25:
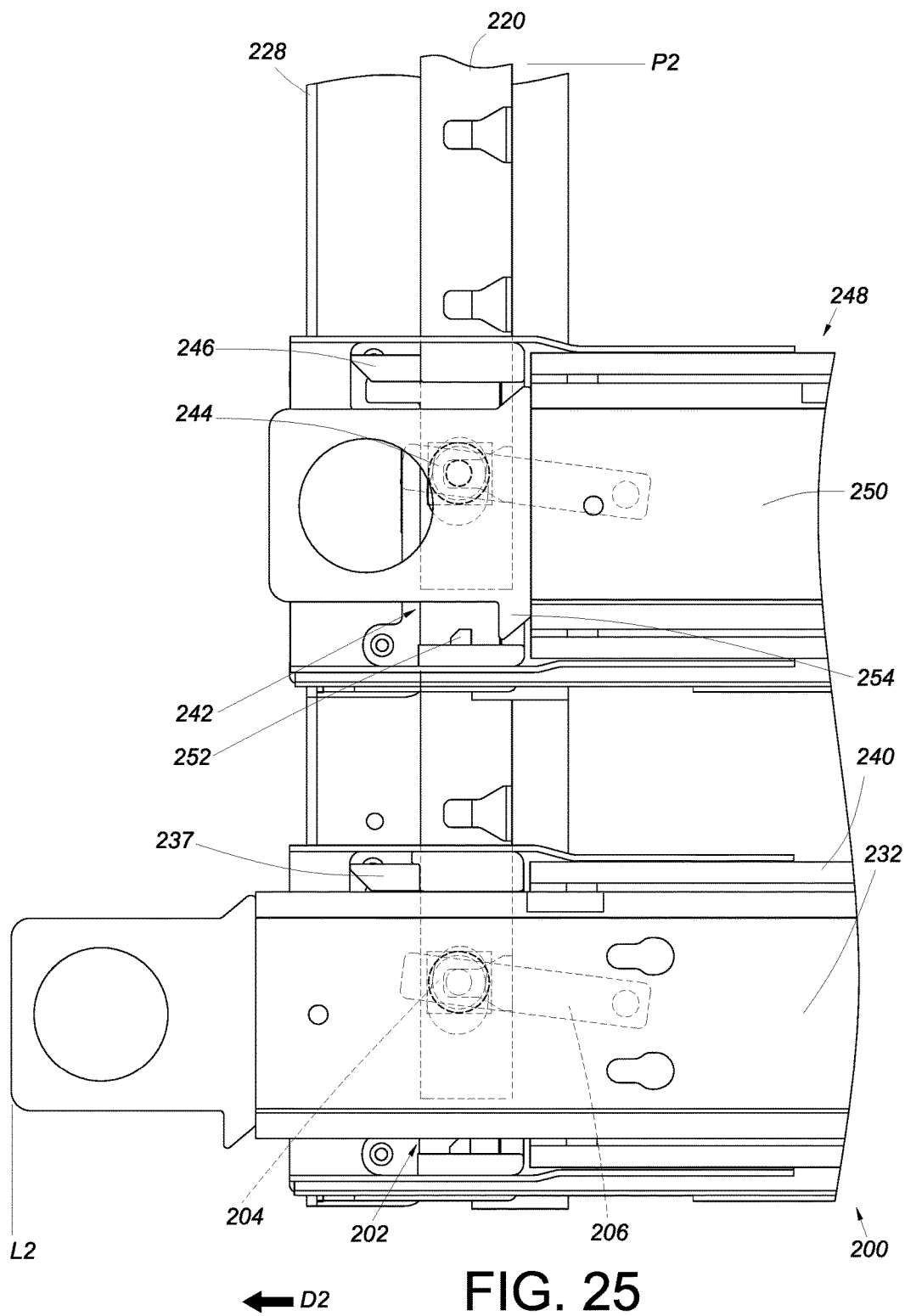
FIG. 25 shows how the second rail of the first slide rail assembly in FIG. 24 is further displaced in the second direction such that the second rail of the second slide rail assembly is blocked.

Referring to FIG. 24 and FIG. 25, the second rail 232 of the first equipment 200 is further displaced in the second direction D2 and reaches the predetermined position L2 with respect to the first rail 240. During the process, the second rail 232 of the first equipment 200 is pressed against the first locking member 237 of the first interlock device 202 and thereby displaces the first locking member 237 of the first interlock device 202 in the third direction D3. Consequently, the first engaging member 204 and the elastic member 206 are displaced, driving the linking member 220 from the first position P1 to the second position P2 with respect to the first post 228. In turn, the second engaging member 244 of the second interlock device 242 drives the second locking member 246 of the second interlock device 242 into displacement in the third direction D3, thereby blocking the second rail 250 of the second slide rail assembly 248. For example, the second locking member 246 of the second interlock device 242 has a blocking portion 252 for blocking the disengaging portion 254 of the second rail 250 of the second slide rail assembly 248.

While the present invention has been disclosed by way of the foregoing preferred embodiments, the embodiments are not intended to be restrictive of the invention. The scope of patent protection sought by the applicant is defined by the appended claims.

What is claimed is:

1. A rack system comprising:
    a rack;
    a chassis, the chassis including a wall having an opening formed therein;
    a linking member; and
    a slide rail assembly, the slide rail assembly including:
        a first slide rail assembly including a first rail and a second rail displaceable with respect to the first rail; and
        a first interlock device provided between the first rail of the first slide rail assembly and the linking member through the opening of the chassis wall, the first interlock device including:
            a first engaging member resiliently biased to extend in a first direction from the linking member to thereby retentively engage the opening of the chassis wall when the chassis is disposed at an installed position within the rack; and
            a first locking member, the first locking member is movably connected to the first rail of the first slide rail assembly, and the first engaging member is connected between the first locking member and the linking member;
    wherein while being displaced from a retracted position with respect to the first rail of the first slide rail assembly to a predetermined position in an opening direction, the second rail of the first slide rail assembly drives the first locking member together with the first engaging member in a second direction transversely oriented relative to the first direction, and thereby displaces the linking member in the second direction from a first position to a second position.

2. The rack system as claimed in claim 1, further comprising a supporting frame connected to the first rail of the first slide rail assembly at a position adjacent to an end portion of the first rail, the first locking member of the first interlock device being movable with respect to the supporting frame.

3. The rack system as claimed in claim 2, wherein the supporting frame has an opening, the first locking member of the first interlock device corresponds to the opening of the supporting frame, and the first engaging member of the first interlock device is inserted through the opening of the supporting frame.

4. The rack system as claimed in claim 1, wherein one of the second rail of the first slide rail assembly and the first locking member of the first interlock device includes a guiding portion for guiding the second rail of the first slide rail assembly to push the first locking member of the first interlock device.

5. The rack system as claimed in claim 4, wherein the guiding portion has an inclined section.

6. The rack system as claimed in claim 1, further comprising an elastic member that applies an elastic force to the first engaging member of the first interlock device.

7. The rack system as claimed in claim 1, further comprising a second slide rail assembly and a second interlock device, the second slide rail assembly including a first rail and a second rail movable with respect to the first rail, the second interlock device having a blocking portion for blocking the second rail of the second slide rail assembly in response to displacement of the linking member from the first position to the second position.

8. The rack system as claimed in claim 7, wherein the second interlock device includes a second locking member and a second engaging member, the second locking member is movably connected to the first rail of the second slide rail assembly and is provided with the blocking portion, and the second engaging member is provided between the second locking member and the linking member, wherein while the linking member is displaced from the first position to the second position, the second engaging member drives the second locking member, the blocking portion of the second locking member thereby blocking the second rail of the second slide rail assembly.

9. The rack system as claimed in claim 1, further comprising a supporting rail mounted on the rack configured to carry the chassis.

10. The rack system as claimed in claim 1, wherein the first slide rail assembly is mounted on the wall of the chassis.

11. The rack system as claimed in claim 10, wherein the second rail of the first slide rail assembly is configured for carrying an object.

12. A rack system comprising:
a supporting rail configured to support a chassis;
a first rail having a supporting frame portion;
a second rail displaceable with respect to the first rail;
a linking member displaceable with respect to the supporting rail and the first and second rails; and
an interlock device movably provided between the first rail and the supporting rail, the interlock device including:
   an engaging member resiliently biased to extend from the supporting rail towards the first rail in a first direction to retentively engage a supported chassis; and
   a locking member movably connected to the first rail and disposed between the engaging member and the linking member;
wherein while being displaced from a retracted position with respect to the first rail to a predetermined position in an opening direction, the second rail displaces the locking member together with the engaging member in a second direction transversely oriented with respect to the first direction, the locking member being thereby displaced responsively in the second direction.

13. The rack system as claimed in claim 12, wherein the interlock device includes a locking member and an engaging member, the locking member is movably connected to the first rail, and the engaging member is movably connected to the supporting rail, wherein while being displaced from the retracted position with respect to the first rail to the predetermined position, the second rail drives the locking member to displace the engaging member.

14. The rack system as claimed in claim 13, wherein the supporting frame portion of the first rail has an opening, the supporting rail has an opening, the engaging member includes a first portion and a second portion connected to the first portion, the first portion is inserted through the locking member via the opening of the first rail, and the second portion is inserted through the opening of the supporting rail.

* * * * *